(12) United States Patent
Sakai et al.

(10) Patent No.: US 10,355,196 B2
(45) Date of Patent: Jul. 16, 2019

(54) PIEZOELECTRIC ELEMENT, PIEZOELECTRIC ELEMENT APPLICATION DEVICE, AND METHOD OF MANUFACTURING PIEZOELECTRIC ELEMENT

(71) Applicant: Seiko Epson Corporation, Tokyo (JP)

(72) Inventors: Tomohiro Sakai, Matsumoto (JP); Kazuya Kitada, Suwa (JP); Koji Sumi, Shiojiri (JP)

(73) Assignee: Seiko Epson Corporation (JP)

( * ) Notice: Subject to any disclaimer, the term of this patent is extended or adjusted under 35 U.S.C. 154(b) by 280 days.

(21) Appl. No.: 15/378,474

(22) Filed: Dec. 14, 2016

(65) Prior Publication Data

US 2017/0229637 A1    Aug. 10, 2017

(30) Foreign Application Priority Data

Feb. 10, 2016   (JP) .................... 2016-024082

(51) Int. Cl.
*H01L 41/27*   (2013.01)
*B41J 2/14*    (2006.01)
(Continued)

(52) U.S. Cl.
CPC .......... *H01L 41/27* (2013.01); *B41J 2/14233* (2013.01); *B41J 2/14274* (2013.01); *B41J 2/161* (2013.01);
(Continued)

(58) Field of Classification Search
CPC combination set(s) only.
See application file for complete search history.

(56) References Cited

U.S. PATENT DOCUMENTS

2008/0308762 A1   12/2008   Ueno et al.
2009/0044390 A1   2/2009    Kuriki et al.
(Continued)

FOREIGN PATENT DOCUMENTS

JP   2006-306709 A   11/2006
JP   2007-184513 A    7/2007
(Continued)

OTHER PUBLICATIONS

Extended European Search Report for EP Application No. 18163254.8, dated Aug. 31, 2018 (7 pages).
(Continued)

*Primary Examiner* — Bryan P Gordon
(74) *Attorney, Agent, or Firm* — Harness, Dickey & Pierce, P.L.C.

(57) ABSTRACT

A piezoelectric element includes a first electrode, a piezoelectric layer formed of a first piezoelectric film which is formed on the first electrode and which includes potassium, sodium, and niobium and a plurality of second piezoelectric films which are formed on the first piezoelectric film and which include potassium, sodium, and niobium, and a second electrode formed on the piezoelectric layer, in which the piezoelectric layer is a stack of a plurality of piezoelectric films, the first piezoelectric film has a thickness of 30 nm to 70 nm, a concentration of sodium in each of the piezoelectric films is along a gradient in the film thickness direction with the first electrode side being high and the second electrode side being low.

4 Claims, 10 Drawing Sheets

(51) Int. Cl.
*H01L 41/047* (2006.01)
*H01L 41/083* (2006.01)
*H01L 41/187* (2006.01)
*B41J 2/16* (2006.01)
*H01L 41/08* (2006.01)
*H01L 41/318* (2013.01)

(52) U.S. Cl.
CPC ........... *B41J 2/1623* (2013.01); *B41J 2/1628* (2013.01); *B41J 2/1629* (2013.01); *B41J 2/1635* (2013.01); *B41J 2/1646* (2013.01); *H01L 41/0472* (2013.01); *H01L 41/083* (2013.01); *H01L 41/0805* (2013.01); *H01L 41/1873* (2013.01); *H01L 41/318* (2013.01); *B41J 2002/14241* (2013.01); *B41J 2002/14258* (2013.01); *B41J 2002/14419* (2013.01); *B41J 2202/03* (2013.01)

(56) References Cited

U.S. PATENT DOCUMENTS

| | | | |
|---|---|---|---|
| 2009/0213190 A1* | 8/2009 | Li | B41J 2/055 347/72 |
| 2013/0009519 A1 | 1/2013 | Shibata et al. | |
| 2014/0118446 A1* | 5/2014 | Izumi | B41J 2/14233 347/70 |
| 2015/0303371 A1* | 10/2015 | Ueno | H03H 9/02031 347/68 |
| 2016/0276572 A1* | 9/2016 | Sumi | B41J 2/14233 |
| 2017/0062697 A1 | 3/2017 | Sakai et al. | |
| 2017/0229637 A1 | 8/2017 | Sakai et al. | |

FOREIGN PATENT DOCUMENTS

| | | |
|---|---|---|
| JP | 2007-227677 A | 9/2007 |
| JP | 2009-038169 A | 2/2009 |
| JP | 2011-204887 A | 10/2011 |
| JP | 2014-033210 A | 2/2014 |
| WO | WO-2012-141104 A1 | 10/2012 |

OTHER PUBLICATIONS

Wang L et al.: "Structures, electrical properties, and leakage current behaviors of un-doped and Mn-doped lead-free ferroelectric K0.5Na0.5Nb03 films", Journal of Applied Physics, vol. 115, No. 3, 034103; Jan. 15, 2014 (Jan. 15, 2014), XP012180655, ISSN: 0021-8979; 7 pages.

* cited by examiner

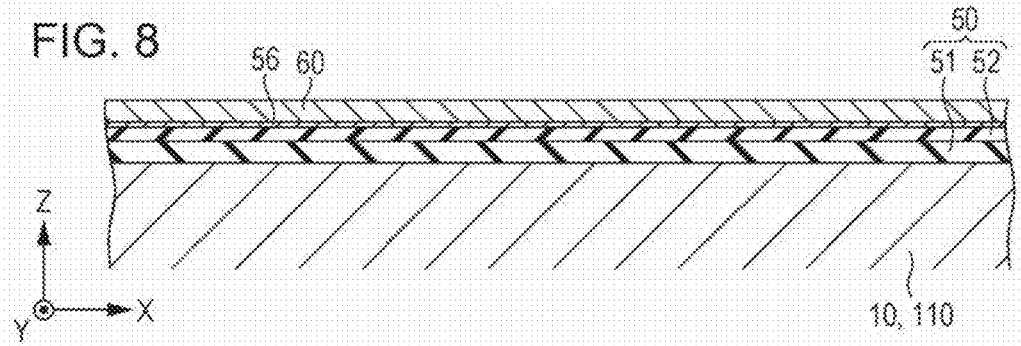
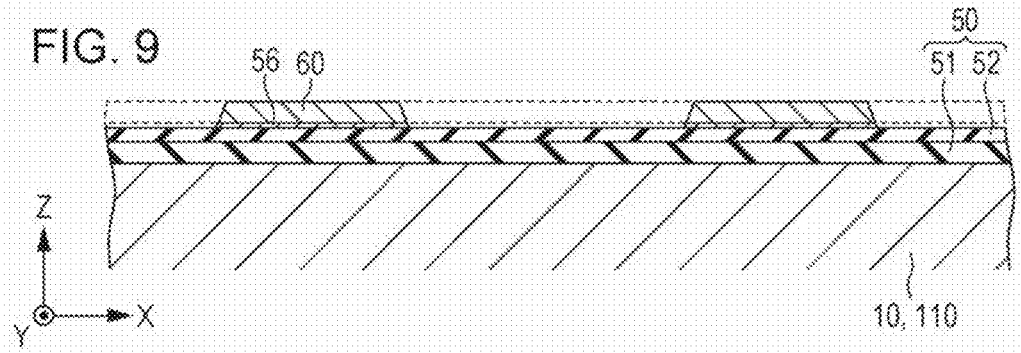
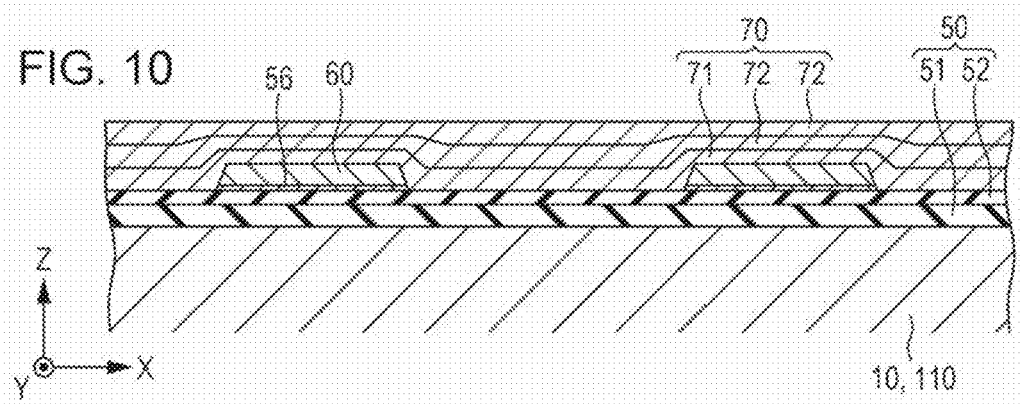
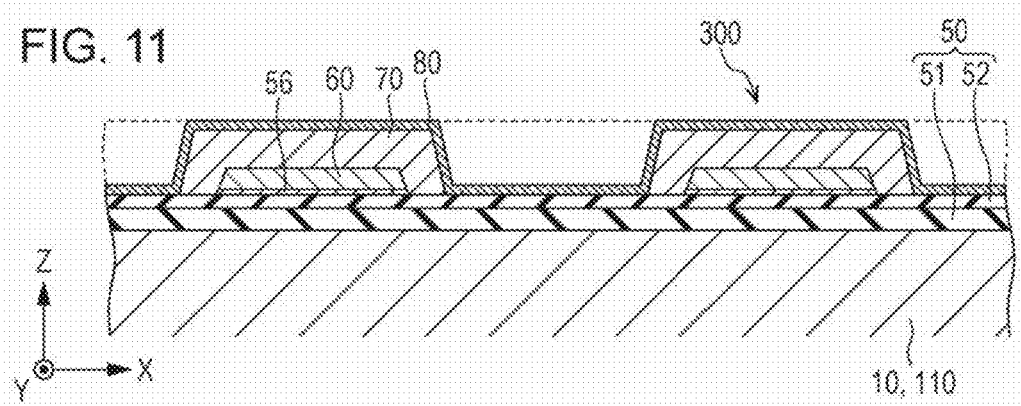

PIEZOELECTRIC ELEMENT, PIEZOELECTRIC ELEMENT APPLICATION DEVICE, AND METHOD OF MANUFACTURING PIEZOELECTRIC ELEMENT

BACKGROUND

1. Technical Field

The present invention relates to a piezoelectric element, a piezoelectric element application device which is provided with a piezoelectric element, and a method of manufacturing a piezoelectric element.

2. Related Art

In general, piezoelectric elements have a piezoelectric layer which has electro-mechanical conversion characteristics, and two electrodes with the piezoelectric layer interposed therebetween. In recent years, devices (piezoelectric element application devices) using such piezoelectric elements as a driving source have been actively developed. As a piezoelectric element application device, there are liquid ejecting heads which are represented by an ink jet recording head, MEMS elements which are represented by a piezoelectric MEMS element, ultrasonic measuring apparatuses which are represented by an ultrasonic sensor or the like, as well as piezoelectric actuator apparatuses, and the like.

As a material (piezoelectric material) for the piezoelectric layer of the piezoelectric element, potassium sodium niobate ((K, Na) NbO$_3$, referred to below as "KNN") has been proposed (for example, refer to JP-A-2009-038169). JP-A-2009-038169 describes that a KNN layer is formed by a sputtering method (gas phase method). Since a KNN sintered body produced by a sintering method is the target in the sputtering method, it is difficult to homogenize the composition distribution (K:Na) at the microscopic level. In addition, taking into account that non-homogeneity of the composition distribution at the microscopic level extends in the in-plane direction, it is considered that the KNN layer formed by this method has a homogeneous composition in the film thickness direction, but that it is difficult to make the composition in the in-plane direction homogeneous.

On the other hand, JP-A-2007-184513 describes forming the KNN layer by using a wet method (liquid phase method). From the point of view of stacking a KNN thin film with a homogeneous composition distribution (K:Na), it is considered that the KNN layer formed by this method has a homogeneous composition in the in-plane direction. That is, in the wet method, when the KNN thin film is crystallized, the element distribution in the sol is homogeneous at the crystal cell (unit cell) level and it is possible to make the distribution homogeneous in the crystal growth direction. Accordingly, the homogeneity of the composition in the in-plane direction of the KNN layer which is a stack of the KNN thin films is expected to be superior to that of a composition formed by the sputtering method.

However, in the wet method, since the KNN layer is formed by stacking the KNN thin film, there is a composition distribution (K:Na) in the film thickness direction (it is difficult to make the composition homogeneous). Thus, there is a demand to realize homogeneity in the composition distribution in the in-plane direction and the film thickness direction in KNN layers formed by a wet method.

Here, this problem is not only limited to piezoelectric elements used in piezoelectric actuators mounted in a liquid ejecting head which is represented by an ink jet recording head, but this problem also similarly affects piezoelectric elements used in other piezoelectric element application devices.

SUMMARY

An advantage of some aspects of the present invention is to provide a piezoelectric element which has a KNN layer formed by a wet method which is a piezoelectric layer with a homogeneous composition distribution in the in-plane direction and the film thickness direction, a piezoelectric element application device, and a method of manufacturing a piezoelectric element.

Here, as the result of extensive research, the present inventors discovered that it is possible to form crystal grains having continuity by ensuring homogeneity of the whole KNN layer by making the shape of or changes in the composition distribution (K:Na) in the film thickness direction homogeneous by controlling the thickness of a KNN thin film which is a first layer, and making the crystal growth direction of each of the KNN thin films in the KNN layer the same by maintaining the homogeneity of the shape of the composition distribution.

According to an aspect of the invention, there is provided a piezoelectric element including a first electrode, a piezoelectric layer formed of a first piezoelectric film which is formed on the first electrode and which includes potassium, sodium, and niobium and a plurality of second piezoelectric films which are formed on the first piezoelectric film and which include potassium, sodium, and niobium, and a second electrode formed on the piezoelectric layer, in which the piezoelectric layer is a stacked structure of a plurality of piezoelectric films, the first piezoelectric film has a thickness of 30 nm to 70 nm, the concentration of sodium in each of the piezoelectric films is along a gradient in a film thickness direction with a first electrode side being high and a second electrode side being low.

In this aspect, it is possible to provide a piezoelectric element with a homogeneous composition distribution in the in-plane direction and the film thickness direction in the piezoelectric layer. In addition, regarding the composition of the piezoelectric layer in the film thickness direction, the concentration of the potassium and sodium in each of the piezoelectric films is along a gradient; however, since the shape of and changes in the distribution of each of the piezoelectric films are substantially the same as each other, it is possible to obtain a piezoelectric element in which homogeneity in the piezoelectric layer as a whole is ensured.

Here, the piezoelectric element preferably includes the first piezoelectric film formed on the first electrode without a titanium film being interposed therebetween. Accordingly, it is possible to eliminate factors contributing to a decrease in the electric characteristics of the piezoelectric element.

In addition, according to another aspect of the present invention, there is provided a piezoelectric element application device provided with the piezoelectric element described above.

In this aspect, it is possible to provide a piezoelectric element application device with stable piezoelectric and dielectric characteristics and robustness (mechanical characteristic) against external stress.

Furthermore, according to still another aspect of the present invention, there is provided a method of manufacturing a piezoelectric element, the method including forming a first electrode; forming a piezoelectric layer by forming a first piezoelectric film with a thickness of 30 nm to 70 nm including potassium, sodium, and niobium on the first electrode with a wet method, and forming a plurality of second piezoelectric films including potassium, sodium, and niobium on the first piezoelectric film with a wet method; and forming a second electrode on the piezoelectric layer, in which, when forming the piezoelectric layer, the concentration of sodium in each of the piezoelectric films is along a gradient in a film thickness direction, with a first electrode side being high and a second electrode side being low.

In this aspect, it is possible to make the distribution of the composition in the piezoelectric layer homogeneous in the in-plane direction and the film thickness direction. In addition, in the composition of the piezoelectric layer in the film thickness direction, the concentration of potassium and sodium in each of the piezoelectric films is along a gradient; however, since the shape of and changes in the distribution of each of the piezoelectric films are substantially the same as each other, it is possible to ensure the homogeneity of the piezoelectric layer as a whole.

BRIEF DESCRIPTION OF THE DRAWINGS

The invention will be described with reference to the accompanying drawings, wherein like numbers reference like elements.

FIG. 8 is a cross-sectional view which shows a method of manufacturing a recording head.

FIG. 9 is a cross-sectional view which shows a method of manufacturing the recording head.

FIG. 10 is a cross-sectional view which shows a method of manufacturing the recording head.

FIG. 11 is a cross-sectional view which shows a method of manufacturing the recording head.

FIG. 19 is a diagram which shows an X-ray diffraction pattern of a sample a.

DESCRIPTION OF EXEMPLARY EMBODIMENTS

Figure 1:
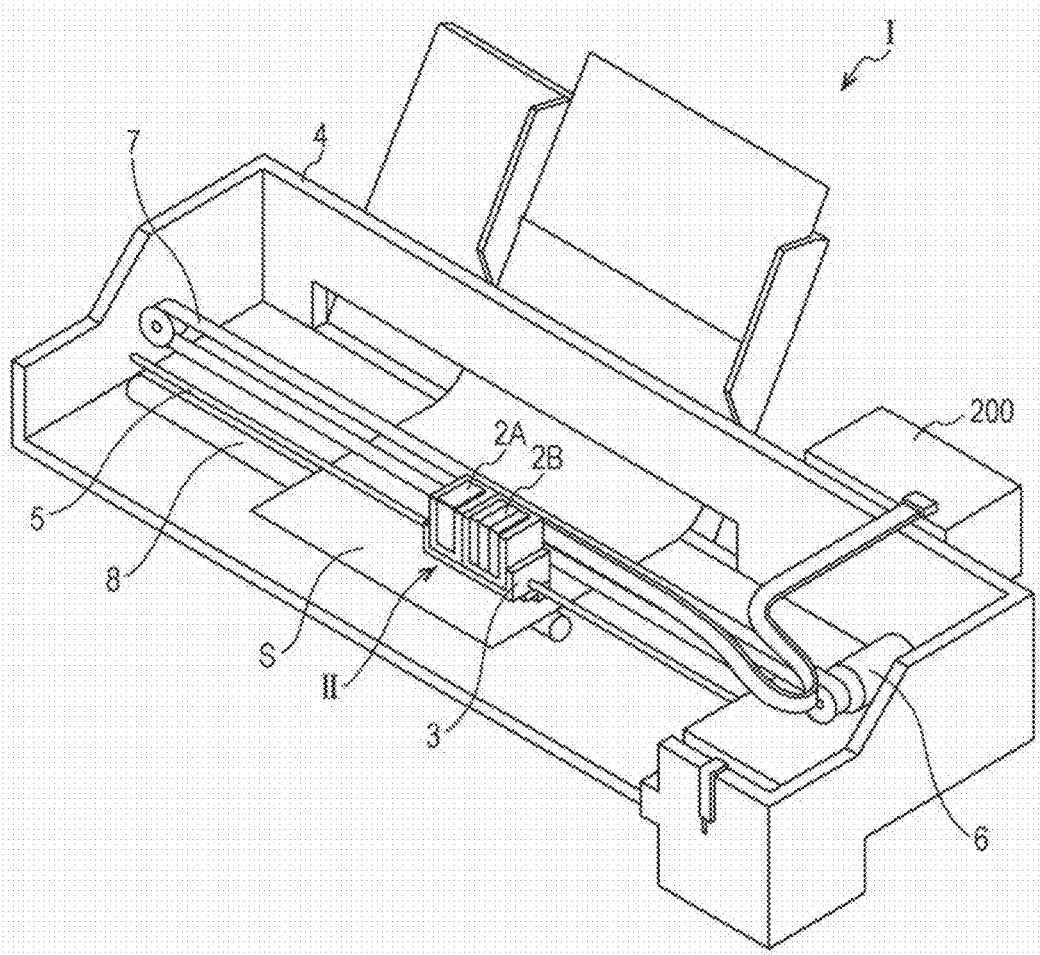
FIG. 1 is a perspective view which shows a schematic configuration of a recording apparatus.

A description will be given below of embodiments of the present invention with reference to the drawings. However, the following description illustrates one aspect of the present invention and can be changed in an optional manner within the scope of the present invention. The same reference numerals are applied in each of the diagrams to illustrate the same members and explanation thereof is omitted as appropriate. In addition, in FIG. 2 to FIG. 5 and FIG. 8 to FIG. 14, X, Y, and Z represent three spatial axes which are perpendicular to each other. In the present specification, a description will be given with the directions along these axes set as the first direction X (X direction), the second direction Y (Y direction), and the third direction Z (Z direction), respectively, and the direction of the arrows in each of the diagrams as the positive (+) direction and the direction opposite to the direction of the arrows as the negative (−) direction. The X direction and Y direction represent the in-plane direction of the plate, layer, and films and the Z direction represents the thickness direction or the stacking direction of the plate, layer, and films.

Embodiment 1

FIG. 1 is an ink jet recording apparatus which is an example of a liquid ejecting apparatus provided with a recording head which is an example of a piezoelectric element application device. As shown in the diagram, in the ink jet recording apparatus (recording apparatus) I, cartridges 2A and 2B, which form the ink supply means, are detachably attached as the ink jet recording head unit (head unit) II which has a plurality of ink jet recording heads. The carriage 3 on which the head unit II is mounted is provided to be freely movable, in the axial direction, on a carriage shaft 5 attached to the apparatus main body 4 and, for example, ejects each color ink composition and a black ink composition.

Here, by transmitting the driving force of the driving motor 6 to the carriage 3 via a plurality of gears (not shown) and the timing belt 7, the carriage 3 on which the head unit II is mounted is moved along the carriage shaft 5. On the other hand, a transport roller 8 is provided as a transport means in the apparatus main body 4, and a recording sheet S which is a recording medium such as paper is transported by the transport roller 8. The transport means which transports the recording sheet S is not limited to being the transport roller 8 and may be a belt, a drum, or the like.

According to a recording apparatus I, since an ink jet recording head (referred to below simply as a "recording head") is provided, low cost manufacturing is possible. In addition, since improvements in the displacement characteristics of the piezoelectric element which forms the piezoelectric actuator are expected, it is possible to improve the ejection characteristics.

Figure 2:
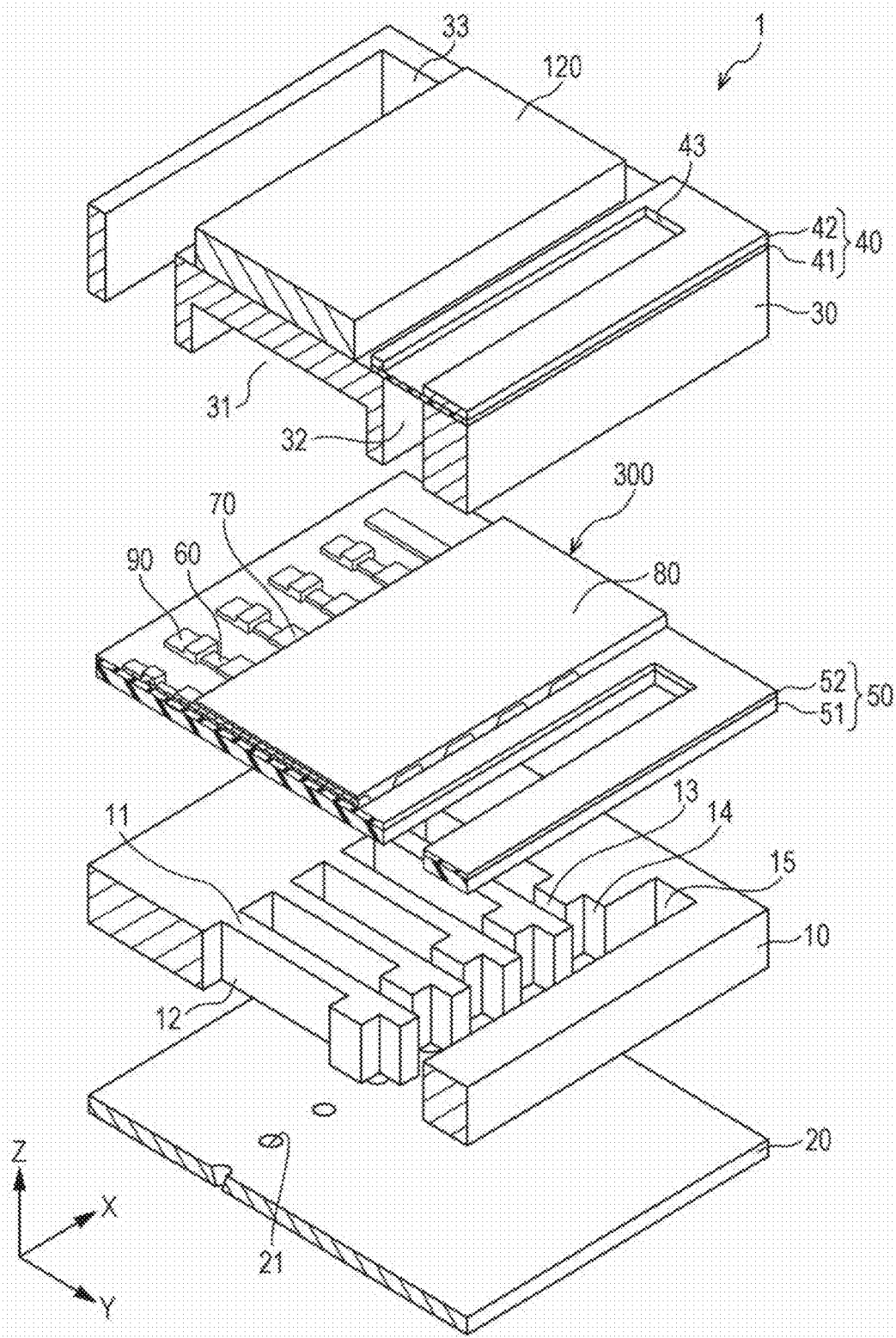
FIG. 2 is an exploded perspective view of a recording head.
Figure 3:
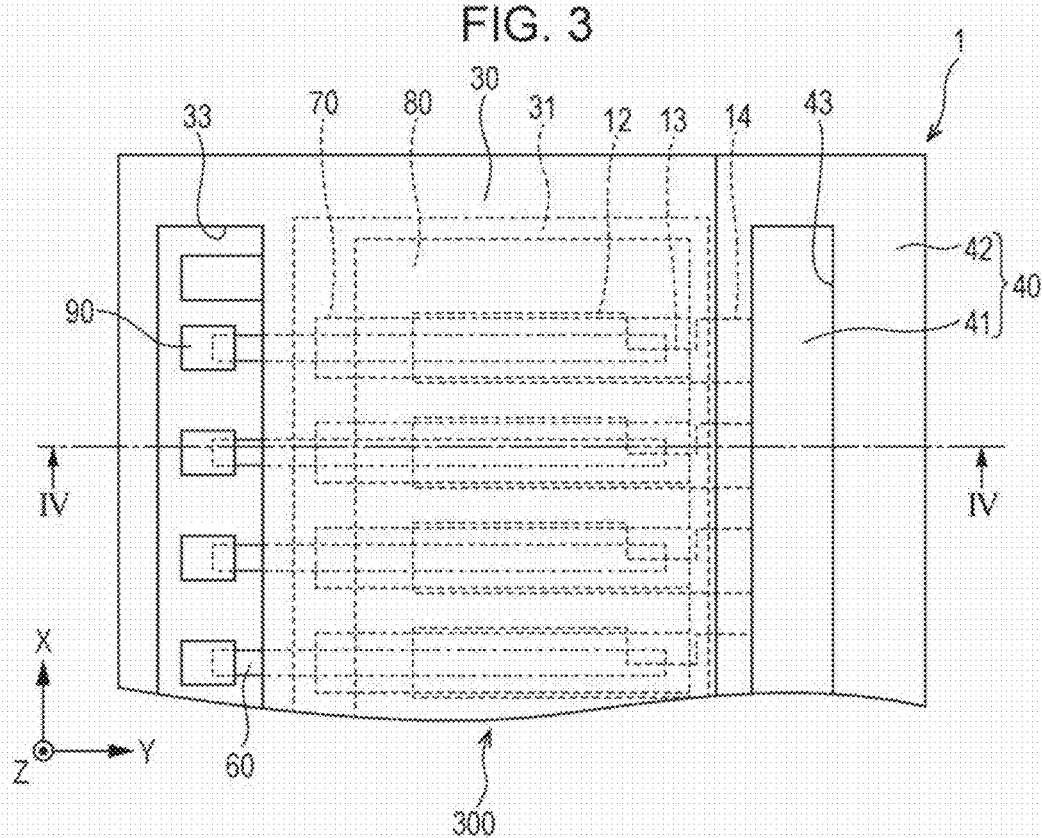
FIG. 3 is a plan view of the recording head.
Figure 4:
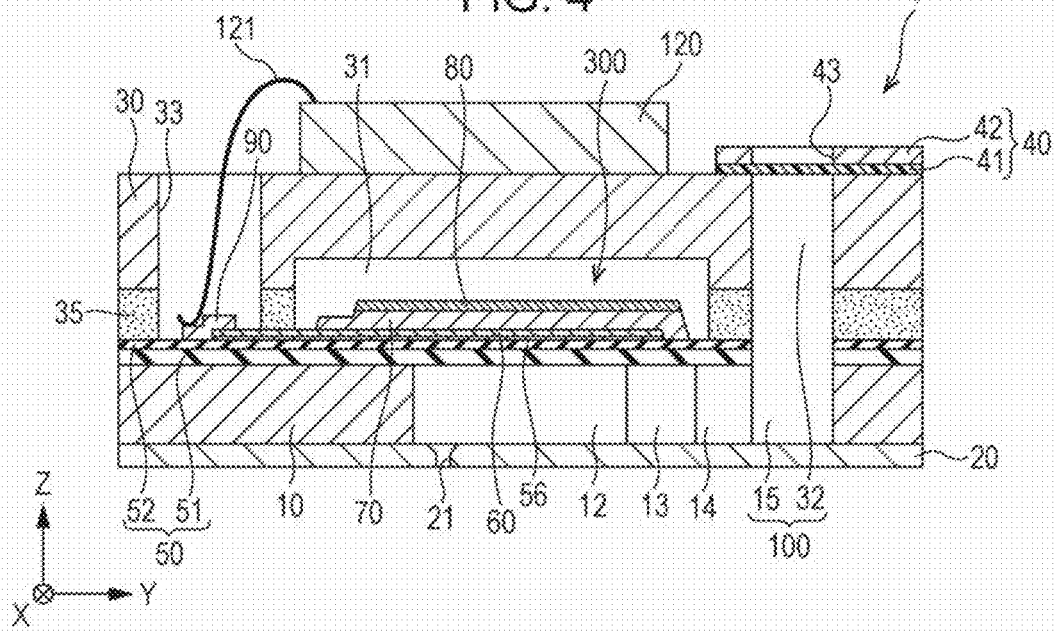
FIG. 4 is a cross-sectional view of line IV-IV in FIG. 3.

A description will be given of an example of a recording head 1 mounted on the recording apparatus I described above with reference to FIG. 2 to FIG. 4. FIG. 2 is an exploded perspective view of a recording head which is an example of a liquid ejecting head. FIG. 3 is a plan view of the piezoelectric element side of the substrate for forming a flow path and FIG. 4 is a cross-sectional view along line IV-IV in FIG. 3.

As shown in the diagram, a substrate 10 is, for example, formed of a silicon single crystal substrate, and pressure-generating chambers 12 are formed therein. Then, the pressure-generating chambers 12 partitioned by a plurality of partition walls 11 are aligned in the X direction in the same manner as a plurality of nozzle openings 21 which eject the same color ink. Here, the material of the substrate 10 is not limited to a silicon single crystal and may be, for example, SOI, a glass ceramic, stainless steel, or the like.

In the substrate 10, an ink supply path 13 and a communication path 14 are formed on one end side of the pressure-generating chamber 12 in the Y direction. The ink supply path 13 is formed such that the opening area is reduced by narrowing one side of the pressure-generating chamber 12 in the X direction. In addition, the communication path 14 has substantially the same width as the pressure-generating chamber 12 in the X direction. A communication portion 15 is formed on the outside (on the +Y direction side) of the communication path 14. The communication portion 15 forms a part of a manifold 100. The manifold 100 forms a common ink chamber for each of the pressure-generating chambers 12. In this manner, a liquid flow path formed of the pressure-generating chambers 12, the ink supply path 13, the communication path 14, and the communication portion 15 are formed on the substrate 10.

A nozzle plate 20 made of, for example, SUS is bonded on one surface (surface on the −Z direction side) of the substrate 10. Nozzle openings 21 are provided aligned in the X direction on the nozzle plate 20. The nozzle openings 21 communicate with each pressure-generating chamber 12. The nozzle plate 20 can be bonded to the substrate 10 by an adhesive, a heat welding film, or the like. Here, the material of the nozzle plate 20 is not limited to SUS and may be, for example, a silicon single crystal, SOI, a glass ceramic, or the like.

On the other surface (the surface on the +Z direction side) of the substrate 10, a vibrating plate 50 is formed. The vibrating plate 50 is, for example, formed of an elastic film 51 formed on the substrate 10 and an insulating film 52 formed on the elastic film 51. The elastic film 51 is, for example, formed of silicon dioxide ($SiO_2$) and the insulating film 52 is, for example, formed of zirconium oxide ($ZrO_2$). The elastic film 51 need not be a member separate from the substrate 10. A part of the substrate 10 is processed to be thin and may be used as an elastic film. A detailed description will be given below of the insulating film 52; however, when a piezoelectric layer including potassium (K) and sodium (Na) as constituent elements is formed, the insulating film 52 has a function as a barrier which prevents the potassium and sodium from reaching the substrate 10 by passing through first electrodes 60.

On the insulating film 52, a piezoelectric element 300 including first electrodes 60, the piezoelectric layer 70, and a second electrode 80 is formed with the adhesive layer 56 therebetween. Each material for the first electrodes 60 and second electrode 80 is preferably a noble metal such as platinum (Pt), iridium (Ir), or palladium (Pd). Each material of the first electrodes 60 and the second electrode 80 may be any material which has conductivity. Each material of the first electrodes 60 and second electrode 80 may be the same or different.

The piezoelectric layer 70 is formed by a solution method (a wet method) and is a composite oxide (KNN-based composite oxide) with a perovskite structure ($ABO_3$ type perovskite structure), which is illustrated by $ABO_3$ in the General Formula and which includes potassium (K), sodium (Na), and niobium (Nb). That is, the piezoelectric layer 70 includes a piezoelectric material formed of a KNN-based composite oxide which is represented by Formula (1).

$$(K_X Na_{1-X})NbO_3 \quad (1)$$

$(0.1 \leq X \leq 0.9)$

As described above, the composite oxide represented by Formula (1) is a so-called KNN-based composite oxide. Since the KNN-based composite oxide is a lead-free piezoelectric material where the content of lead (Pb) or the like is reduced, the biocompatibility is excellent and the environmental impact is also small. Moreover, among lead-free piezoelectric materials, since the KNN-based composite oxide has excellent piezoelectric characteristics, the KNN-based composite oxide has an advantage in that various types of characteristics are improved. In addition, since the KNN-based composite oxide has a comparatively high Curie temperature compared with other lead-free piezoelectric materials (for example, BNT-BKT-BT; [(Bi, Na)$TiO_3$]—[(Bi, K)$TiO_3$]—[$BaTiO_3$]) and is not easily depolarized due to increases in temperature, use at high temperatures is possible.

In Formula (1), the content of K is preferably 30 mol % to 70 mol % with respect to the total amount of the metal element forming the A site (in other words, the content of Na is 30 mol % to 70 mol % with respect to the total amount of the metal elements forming the A site). That is, in Formula (1), it is preferable that $0.3 \leq x \leq 0.7$. Accordingly, a composite oxide having a composition with advantageous piezoelectric characteristics is formed. In addition, the content of K is more preferably 35 mol % to 55 mol % with respect to the total amount of the metal element forming the A site (in other words, the content of Na is 45 mol % to 65 mol % with respect to the total amount of the metal elements forming the A site). That is, in Formula (1), it is preferable that $0.35 \leq x \leq 0.55$. Accordingly, a composite oxide having a composition with more advantageous piezoelectric characteristics is formed.

The piezoelectric material which forms the piezoelectric layer 70 is not limited to the composition represented by Formula (1) as long as the material is a KNN-based composite oxide. For example, other metal elements (additives) may be included in the A site and B site of the potassium sodium niobate. Examples of such additives include manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn), copper (Cu), and the like. One or more of these types of additives may be included. Typically, the additive amount is 20% or less with respect to the total amount of the elements which are the main components, preferably 15% or less, and more preferably 10% or less. Using the additives makes it easy to vary the composition and functions by improving the various characteristics; however, it is preferable that KNN be present in an amount of more than 80% from the point of view of exhibiting characteristics derived from KNN. Here, even in a case of a composite oxide including these other elements, the composite oxide is preferably formed to have an $ABO_3$ type perovskite structure.

The alkali metal of the A site may be excessively added with respect to the stoichiometric composition. In addition, the alkali metal of the A site may be insufficient with respect to the stoichiometric composition. Accordingly, the composite oxide of the present embodiment can also be represented by Formula (2).

$$(K_{AX} Na_{A(1-X)})NbO_3 \quad (2)$$

(0.1≤x≤0.9, preferably 0.3≤x≤0.7, more preferably 0.35≤x≤0.55)

In Formula (2), A represents the amount of K and Na which may be added excessively or the amount of K and Na which may be insufficient. In a case where the amount of K and Na is excessive, 1.0<A. In a case where the amount of K and Na is insufficient, A<1.0. For example, if A=1.1, when the amount of K and Na in the stoichiometric composition is set to 100 mol %, A=1.1 represents that K and Na of 110 mol % are included. If A=0.9, when the amount of K and Na in the stoichiometric composition is set to 100 mol %, A=0.9 represents that K and Na of 90 mol % are included. Here, in a case where the alkali metal of the A site is neither excessive nor insufficient with respect to the stoichiometric composition, A=1. From the point of view of improving the characteristics, 0.85≤A≤1.15, preferably 0.90≤A≤1.10, and more preferably 0.95≤A≤1.05.

The piezoelectric materials may also include materials having a composition where one element is insufficient, materials having a composition where one element is excessive, and materials having a composition where one element is substituted with another element. As long as the basic characteristics of the piezoelectric layer are not changed, a material that deviates from the stoichiometric composition by being insufficient or excessive, and a material where one element is substituted with another element may also be included in the piezoelectric material according to the present embodiment.

In addition, "the composite oxide with the $ABO_3$ type perovskite structure including K, Na, and Nb" in the present specification is not limited to only a composite oxide with an $ABO_3$ type perovskite structure including K, Na, and Nb. In other words, "the composite oxide with the $ABO_3$ type perovskite structure including K, Na, and Nb" in the present specification includes piezoelectric materials represented by mixed crystals including a composite oxide with a $ABO_3$ type perovskite structure including K, Na, and Nb (for example, the KNN-based composite oxide illustrated above) and another composite oxide having an $ABO_3$ type perovskite structure.

The other composite oxide is not limited while within the scope of the present invention, but is preferably a lead-free piezoelectric material. In addition, the other composite oxide is more preferably a lead-free piezoelectric material which does not contain bismuth (Bi). Accordingly, a piezoelectric element 300 having excellent biocompatibility and a low environmental impact is formed.

The piezoelectric element 300 is formed via an adhesive layer 56 for improving the adhesion of the first electrodes 60 and an underlayer (the substrate 10) described above. As the adhesive layer 56, it is possible to use, for example, titanium oxide ($TiO_x$), titanium (Ti), silicon nitride (SiN), or the like. In addition, the adhesive layer 56 functions as a stopper which prevents the potassium and sodium from reaching the substrate 10 by passing through the first electrodes 60 in the same manner as the insulating film 52. Here, the adhesive layer 56 may be omitted.

In the present embodiment, the piezoelectric element 300 and the vibrating plate 50 which generates displacement due to the driving of the piezoelectric element 300 are collectively referred to as the actuator apparatus. In more detail, the vibrating plate 50 and the first electrodes 60 are displaced due to the displacement of the piezoelectric layer 70 which has electro-mechanical conversion characteristics. That is, the vibrating plate 50 and the first electrodes 60 function substantially as a vibrating plate without being limited thereto. For example, by omitting one or both of the elastic film 51 and the insulating film 52, either the film and the first electrodes 60 or only the first electrodes 60 may be set to function as the vibrating plate. Alternatively, the piezoelectric element 300 itself may also substantially function as the vibrating plate. In a case of providing the first electrodes 60 directly on the substrate 10, it is preferable to protect the first electrodes 60 with a protective film or the like with an insulating property such that ink does not contact the first electrodes 60.

In such a piezoelectric element 300, in general, one of the electrodes is a common electrode which is made to be in common and the other electrode is set to be an individual electrode (referred to below as an "individual electrode") by patterning each of the pressure-generating chambers 12. As will be described in detail below, in the present embodiment, the first electrodes 60 are set as individual electrodes and the second electrode 80 is set as a common electrode; however, there is no problem if the electrodes are reversed for the convenience of the driving circuit 120 or the connection wiring 121. Here, in the present embodiment, the common electrode is formed by continuously forming the second electrode 80 across the plurality of pressure-generating chambers 12.

The first electrodes 60 are provided with a narrower width than the width of the pressure-generating chambers 12 in the X direction for each region opposing each of the pressure-generating chambers 12. In addition, the first electrodes 60 extend from one end side to above the circumferential wall in the longitudinal direction (−Y direction) of each of the pressure-generating chambers 12. Then, lead electrodes 90 formed of, for example, gold (Au) or the like are respectively connected to the first electrodes 60 in regions outside the pressure-generating chambers 12 and a voltage is selectively applied to each of the piezoelectric elements 300 via the lead electrodes 90. That is, the first electrodes 60 form individual electrodes as described above. On the other hand, the ends of the first electrodes 60 on the other end side of the pressure-generating chambers 12 in the longitudinal direction (+Y direction) are positioned inside a region opposing the pressure-generating chambers 12 when seen from the Z direction.

The piezoelectric layer 70 is provided between the first electrodes 60 and the second electrode 80. The piezoelectric layer 70 is formed with a wider width than the X direction width of the first electrodes 60 and, in addition, formed with a wider width than the Y direction width of the pressure-generating chambers 12. One end of the piezoelectric layer 70 (end in the +Y direction) is formed further to the outside than one end (the end in the +Y direction) of the first electrodes 60 and the first electrodes 60 are covered by the piezoelectric layer 70. On the other hand, the other end (end in the −Y direction) of the piezoelectric layer 70 is further inside than the other end (end in the −Y direction) of the first electrodes 60 and the first electrodes 60 is covered by the lead electrode 90.

When viewed from the Z direction, the second electrode 80 is continuously formed in a region which opposes the plurality of pressure-generating chambers 12 and forms a common electrode as described above. That is, the second electrode 80 is provided to cover substantially the entirety of the upper surface of the piezoelectric layer 70 of the region opposing the pressure-generating chambers 12 and both end surfaces in the X direction. At the time of driving, a voltage is applied to the piezoelectric layer 70 of the region (driving portion) where the first electrodes and the second electrode 80 overlap. Since the upper surface and both end surfaces in the X direction of the piezoelectric layer 70 are covered by the second electrode 80, the permeation of moisture (humidity) in the atmosphere into the piezoelectric layer 70 in accordance with the driving is prevented. Accordingly, it is possible to prevent damage to the piezoelectric element 300 caused by moisture, and it is possible to remarkably improve the durability of the piezoelectric element 300.

The protective substrate 30 is bonded by an adhesive 35 on the substrate 10 on which the piezoelectric elements 300 are formed. The protective substrate 30 has a manifold portion 32. At least a portion of the manifold 100 is formed of the manifold portion 32. In the present embodiment, the manifold portion 32 extends through the protective substrate 30 in the thickness direction (Z direction) and is formed across the width direction (X direction) of the pressure-generating chambers 12. Then, as described above, the manifold portion 32 communicates with the communication portion 15 of the substrate 10. According to this configuration, the manifold 100 which forms a common ink chamber of each of the pressure-generating chambers 12 is formed.

In the protective substrate 30, a piezoelectric element holding portion 31 is formed in a region including the piezoelectric element 300. The piezoelectric element holding portion 31 has a space large enough not to hinder the movement of the piezoelectric element 300. This space may be sealed or may not be sealed. In addition, in the protective substrate 30, a through hole 33 which passes through the protective substrate 30 in the thickness direction (Z direction) is provided. In the through hole 33, the ends of the lead electrodes 90 are exposed.

On the protective substrate 30, a driving circuit 120 which functions as a signal processing portion is fixed. The driving circuit 120 can use, for example, a circuit board or a semiconductor integrated circuit (IC). The driving circuit 120 and the lead electrode 90 are electrically connected via connection wiring 121 formed of conductive wiring such as bonding wiring inserted into the through hole 33. The driving circuit 120 can be electrically connected to a printer controller 200 (refer to FIG. 1). This driving circuit 120 functions as a control means of the actuator apparatus (the piezoelectric element 300).

In addition, on the protective substrate 30, a compliance substrate 40 formed of a sealing film 41 and a fixing plate 42 is bonded. The sealing film 41 is formed of a material with a low rigidity and the fixing plate 42 can be formed of a hard material such as metal. When viewed from the Z direction, the region of the fixing plate 42 opposing the manifold 100 forms an opening portion 43 which is completely removed in the thickness direction (the Z direction). One surface (the surface in the +Z direction) of the manifold 100 is sealed only by the sealing film 41 which has flexibility.

Here, examples of the material for the protective substrate 30 include glass, ceramic material, metal, resin, and the like, and the protective substrate 30 is more preferably formed by a material with substantially the same thermal expansion coefficient as the substrate 10. In the present embodiment, a silicon single crystal substrate which is the same material as the substrate 10 is used to form the protective substrate 30.

Figure 5:
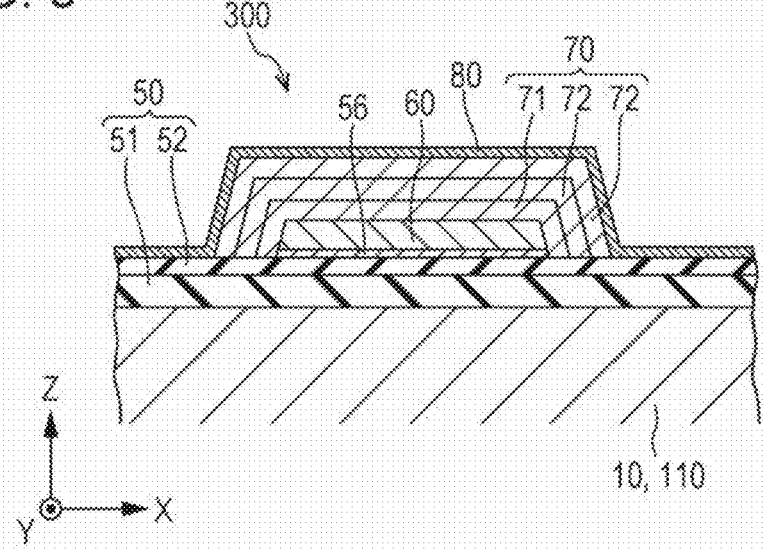
FIG. 5 is a cross-sectional view which shows an example of a schematic configuration of a piezoelectric element.

Next, a detailed description will be given of the piezoelectric element 300 with reference to FIG. 5. FIG. 5 is a cross-sectional view which shows an example of a schematic configuration of the piezoelectric element included in a recording head mounted on a recording apparatus. As shown in the diagram, the piezoelectric element 300 includes the first electrodes 60 with a thickness of approximately 50 nm, the second electrode 80 with a thickness of approximately 50 nm, and the piezoelectric layer 70 provided between the first electrodes and the second electrode 80. At this time, the piezoelectric layer 70 is a stack of a plurality of piezoelectric films, and is formed of a first piezoelectric film 71 having a thickness of 30 nm to 70 nm and a plurality of second piezoelectric films 72 formed on the first piezoelectric film 71, and the concentration of the sodium in the first piezoelectric film 71 and the plurality of second piezoelectric films 72 is along a gradient in the film thickness direction (Z direction), being high on the first electrodes 60 side and low on the second electrode 80 side.

The first piezoelectric film 71 and the second piezoelectric films 72 each include potassium, sodium, and niobium. That is, the first piezoelectric film 71 and the second piezoelectric films 72 are formed of the KNN-based composite oxide described above, specifically, a KNN film formed of a KNN crystal which is highly oriented with a predetermined crystal plane due to the crystallization (crystallization by a heat treatment to remove unnecessary substances such as solvents from a precursor solution of the KNN-based composite oxide).

In the present embodiment, in the piezoelectric layer 70, by defining the thickness of the first piezoelectric film 71 within the range described above and further forming the plurality of second piezoelectric films 72 on the upper layer thereof, it is possible to define the shape of and changes in the concentration distribution of the sodium in the first piezoelectric film 71 and the plurality of the second piezoelectric films 72. Due to this, in the piezoelectric layer 70, it is possible to make the composition distribution homogeneous in the in-plane direction (X direction) and the film thickness direction (Z direction). At this time, the thickness of the plurality of second piezoelectric films 72 is preferably set to be respectively 50 nm to 100 nm; however, the thickness is not particularly limited. In addition, FIG. 5 shows a configuration example of the piezoelectric element 300 in which two layers of the second piezoelectric films 72 are each formed on the upper layer of the first piezoelectric film 71; however, the configuration is not limited thereto. In the piezoelectric element 300, since the piezoelectric layer 70 is a so-called thin film piezoelectric body with a thickness of 50 nm to 2000 nm, after the thickness of the first piezoelectric film 71 is determined, the number of layers and thickness of the second piezoelectric films 72 are determined.

Here, the thickness of the first electrodes 60, the second electrode 80, and the piezoelectric layer 70 listed here are all examples and can be changed within a range which does not depart from the gist of the present invention.

Next, according to the configuration described above, a detailed description will be given of the mechanism for homogenizing the composition distribution in the in-plane direction (X direction) and the film thickness direction (Z direction) in the piezoelectric layer 70.

Figure 6:
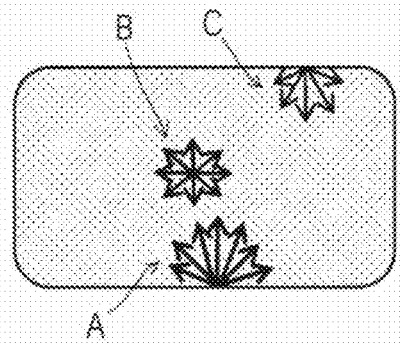
FIG. 6 is a diagram which shows each starting point of thin film crystallization.
Figure 7:
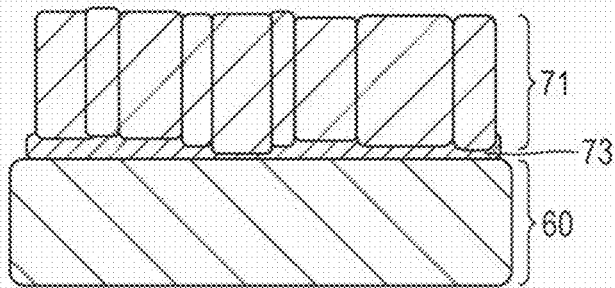
FIG. 7 is a cross-sectional view which shows an example of a thin film crystallization pattern.

FIG. 6 is a diagram which shows the respective starting points of crystallization in the thin film when forming the piezoelectric films and FIG. 7 is a cross-sectional view which shows an example of a crystallization pattern in the thin film when forming the first piezoelectric film. As shown in FIG. 6, it is considered that, in general, there are three patterns in which the thin film crystallizes into a piezoelectric body. That is, there are three starting points of the crystallization, which are (A) the interface with the lower layer (the first electrodes 60), (B) inside the thin film, and (C) the thin film surface. Since a condition for forming a starting point of crystallization is that the activation energy is low, whether the starting point of the crystallization is the starting point (A), the starting point (B), or the starting point (C) depends on the magnitude of the activation energy at each location.

When the thickness of the first piezoelectric film 71 is less than 30 nm, condensation occurs in the process of manufacturing the piezoelectric layer, a place where the first piezoelectric film 71 is present and a place where the first piezoelectric film 71 is not present are generated on the first electrodes 60, and the place where the first piezoelectric film 71 is not present leads to subsequent forming of spaces in the piezoelectric layer 70, which causes an adverse effect on the electric reliability, the mechanical reliability, and the continuous growth property in the orientation at the time of crystal growth.

In addition, when the thickness of the first piezoelectric film 71 exceeds 70 nm, the starting point of the crystal growth moves to the inside of the thin film or to the thin film surface. In a case where the crystal growth starting point is present in the first piezoelectric film 71 (the starting point (B) in FIG. 6), since the starting point of the crystal growth is equal in three dimensions, there is no factor which determines the orientation, and, as a result, the orientation is random. In addition, in a case where the crystal growth starting point is present in the thin film surface (the starting point (C) in FIG. 6), as shown in FIG. 7, since the first electrodes 60 interface is the end of the crystal growth, a heterogeneous phase 73 is formed between the first piezoelectric film 71 and the first electrodes 60, and this is a factor behind the electric resistance and the mechanical characteristics being decreased, or the crystal grains being prevented from growing continuously and the degree of orientation being decreased even when oriented. In other words, when the thickness of the first piezoelectric film 71 is outside a suitable range, since continuous crystal growth is inhibited and continuous crystallization does not occur from on the first electrodes 60, the piezoelectric layer 70 is obtained in which the composition distribution is non-homogeneous, the orientation is random, and the orientation is insufficient even when oriented.

On the other hand, the thickness of the first piezoelectric film 71 is set to 30 nm to 70 nm, the starting point of the crystal growth moves to the interfaces with the first electrodes 60 (starting point (A) in FIG. 6). That is, when the KNN of the first piezoelectric film 71 is crystallized, the crystallization starting point is not in the thin film or on the thin film surface side, but is present on the first electrodes 60 interface side, the gradient of the Na concentration of the first piezoelectric film 71 (KNN film) is low on the layer surface side and high at the first electrodes 60 interface side, and the gradient of the K concentration is naturally the reverse of the gradient of the Na concentration. Due to the crystallization starting point being present on the first electrodes 60 interface side, the crystal state of the first electrodes 60 oriented with the (111) plane is reflected, the crystal plane is highly oriented with the (001) plane, and a KNN film where the composition distribution is homogeneous in the in-plane direction and the film thickness direction is obtained. Forming the plurality of second piezoelectric films 72 (KNN film) on the layer obtains a KNN film where the crystal surface is highly oriented with the (001) plane is stacked by continuing from the orientation of the KNN film of the lower layer, and the piezoelectric layer (KNN layer) highly oriented with the (001) plane. In addition, in the composition of the piezoelectric layer 70 in the film thickness direction, the concentration of K and Na in each of the piezoelectric films (KNN films) is along a gradient; however, since the shape of and the changes in the distribution of each of the piezoelectric films are substantially the same in all of the piezoelectric films, it is possible to ensure the homogeneity of the piezoelectric layer 70 as a whole.

Then, using a wet method is extremely advantageous compared to using a sputtering method for forming the piezoelectric layer 70 with a homogeneous composition distribution with a large area (for example, a substrate of inches or more) by enabling the realization of the piezoelectric layer 70 which has homogeneity of the composition distribution in the film thickness direction.

Here, a noble metal (Pt, Ir, Pd, or the like) often used as an electrode (here as the first electrodes 60) has little surface free energy and starting the crystallization of the KNN from the first electrodes 60 surface is generally difficult. Here, a Ti film with a maximum thickness of approximately 2 nm is film formed on the Pt or Ir surface. That is, since the surface free energy of the Ti is greater than that of the Pt or Ir, by forming a Ti film on the first electrodes 60 and forming the first piezoelectric film 71 (KNN film) on top thereof, the KNN crystallization starting point is easily set on the first electrodes 60 interface side and it is possible to obtain a first piezoelectric film 71 highly oriented with the (001) plane. However, when the KNN thin film is crystallized on the Ti film, the Ti atoms are diffused in the KNN thin film and defects which decrease the electrical resistance of the thin film are generated. Then, in the present embodiment, as described above, by setting the thickness of the first piezoelectric film 71 to 30 nm to 70 nm, even when the Ti film is not formed on the first electrodes 60, it is possible to obtain a first piezoelectric film 71 which is highly oriented with the (001) plane by setting the Pt electrode (first electrodes 60) interface as the KNN crystal growth starting point. Here, this may not be the case in a case where measures are taken to prevent diffusion of the Ti atoms in the KNN thin film.

The Pt used as the first electrodes 60 is generally oriented with the (111) plane, it is possible to highly orient the first piezoelectric film 71 (KNN film) formed thereon with the (001) plane without forming the Ti film which is an orientation control layer. In the present invention, on the Pt first electrodes 60 oriented with the (111) plane, by setting the thickness of the first piezoelectric film 71 of the KNN film to 30 nm to 70 nm, it is possible orient the first piezoelectric film 71 with the (001) plane. Although the reason therefor is not clear, the following mechanisms can be considered.

That is, a model may be considered in which, when the KNN is crystallized on the Pt oriented with the (111) plane, the orientation state of the Pt is dragged and pyrochlore (an intermediate product) with a lower crystallization temperature than the KNN is oriented with the (111) plane on the Pt and, when the KNN is crystallized thereon, a KNN core where an oxygen octahedron is crystallized is formed in the pyrochlore and the pyrochlore is lost as the crystallization of the KNN progresses. In other words, it is considered that, since the pyrochlore formed on the Pt oriented with the (111) plane is oriented with the (111) plane, the oxygen octahedron in the natural pyrochlore is also in an oriented state and is re-crystallized as KNN by moving to a position where the K and Na in the pyrochlore adopt a perovskite structure as the starting point of the oriented oxygen octahedron, thus the KNN is oriented with the (001) plane and the pyrochlore is lost at the stage where the crystallization of the KNN ends.

Here, the piezoelectric layer 70 formed of the piezoelectric film (KNN film) highly oriented with the (001) plane refers to a layer where the KNN crystal is preferentially oriented with the (001) plane in the present embodiment. For example, the piezoelectric layer 70 formed of a KNN-based composite oxide is easily naturally oriented with the (001) plane. In addition, the piezoelectric layer 70 may be preferentially oriented with the (110) plane or the (111) plane using a predetermined orientation control layer provided as necessary. The piezoelectric layer 70 preferentially oriented with a predetermined crystal plane easily improves various characteristics in comparison with a randomly oriented piezoelectric layer. Here, in the present specification, preferential orientation refers to 50% or more, preferably 80% or more, of the crystal being oriented with a predetermined crystal plane. For example, "preferentially oriented with the (001) plane" includes a case where all of the crystal of the piezoelectric layer 70 is oriented with the (001) plane and a case where half or more of the crystal (50% or more, preferably 80% or more) is oriented with the (001) plane.

In addition, since the piezoelectric layer 70 is polycrystalline, the stress in the plane is dispersed and homogeneous, thus stress fractures do not easily occur in the piezoelectric element 300 and the reliability is high.

The crystalline state of the piezoelectric layer 70 mainly changes according to the composition ratio of elements forming the piezoelectric body and the conditions (for example, the firing temperature, the temperature increase rate of the firing, and the like) when forming the piezoelectric layer 70. Adjusting these conditions as appropriate makes it possible to control the crystal system of the piezoelectric layer 70 such that a peak derived from a predetermined crystal plane is observed.

Next, with reference to FIG. 8 to FIG. 14, a description will be given of an example of the method of manufacturing the piezoelectric element 300 in conjunction with a method of manufacturing a recording head 1 mounted on the recording apparatus I. FIG. 8 to FIG. 14 are cross-sectional views which show a method of manufacturing a recording head which is an example of a liquid ejecting head.

First, as shown in FIG. 8, by preparing the wafer 110 which is a silicon substrate and subjecting the wafer 110 to thermal oxidation, an elastic film 51 formed of silicon dioxide is formed on the surface thereof. Next, a zirconium film is formed by a sputtering method on the elastic film 51 and the insulating film 52 is formed by subjecting the zirconium film to thermal oxidation. In this manner, a vibrating plate 50 formed of the elastic film 51 and the insulating film 52. Then, the adhesive layer 56 formed of titanium oxide is formed on the insulating film 52 by a sputtering method, thermal oxidation of the titanium film, or the like, and the first electrodes 60 are formed on the adhesive layer 56 by a sputtering method, an evaporation method, or the like.

Next, as shown in FIG. 9, the resist with a predetermined shape which is not shown is formed as a mask on the first electrodes 60, and the first electrodes 60 and the adhesive layer 56 are patterned at the same time. Next, as shown in FIG. 10, the first piezoelectric film 71 is formed so as to overlap with the first electrodes 60 and the vibrating plate 50 and a plurality of layers of the second piezoelectric films 72 are formed on the upper layer thereof. The piezoelectric layer 70 is formed by the plurality of layers of piezoelectric films.

In addition, it is possible to form the piezoelectric layer 70 by, for example, a solution method such as a MOD method or a sol-gel method (chemical solution method). In this manner, using the solution method (wet method), by forming the piezoelectric layer 70, it is possible to increase the productivity of the piezoelectric layer 70. The piezoelectric layer 70 formed by a wet method has the first piezoelectric film 71 which is a KNN film formed by a series of steps from a step of coating a precursor solution to be described below (coating step) up to a step of firing a precursor film (firing step), and a plurality of the second piezoelectric films 72 which are KNN films formed by a series of steps in the same manner on the upper layer thereof. That is, the piezoelectric layer 70 is formed by repeating the series of steps a plurality of times from the coating step up to the firing step. Here, in the series of steps from the coating step up to the firing step in the forming of the first piezoelectric film 71 and the second piezoelectric films 72, after repeating from the coating step to a degreasing step (to be described below) a plurality of times, a KNN film may be formed by carrying out a firing step. In the Examples which will be described below, a manufacturing example is given where the first piezoelectric film 71 and each of the second piezoelectric films 72 are formed by performing the series of steps from the coating step up to the firing step one time; however, as long as it is possible to set the thickness of the first piezoelectric film 71 to 30 nm to 70 nm and set each of the second piezoelectric films 72 to, for example, 50 nm to 100 nm, the number of repetitions from the coating step up to the degreasing step is not limited.

That is, in the present embodiment, the "forming the first piezoelectric film 71 with a thickness of 30 nm to 70 nm" has the meaning of forming a thin film (KNN film) formed of a KNN crystal with a thickness of 30 nm to 70 nm. That is, the number of repetitions from the coating step to the degreasing step is not limited; however, ultimately, the thickness of the KNN film, that is, the first piezoelectric film 71 obtained through the firing step, may be in the range described above. In the same manner, "forming a plurality of the second piezoelectric films 72" has the meaning of forming two layers or more of KNN films. That is, the number of repetitions from the coating step up to the degreasing step is not limited; however, ultimately, it is sufficient if two layers or more of the second piezoelectric films 72 which are KNN films formed through the firing step are formed. That is, at the time of carrying out the firing step, the thickness of the first piezoelectric film 71 and the second piezoelectric films 72 is determined. In the present embodiment, the piezoelectric layer 70 is formed by combining the first piezoelectric film 71 and the plurality of second piezoelectric films 72 formed in this manner.

A layer or film formed by a wet method has an interface. Evidence of the coating or firing remains on the layer or film formed by the wet method and this evidence is an "interface" which can be confirmed by observing the cross-section thereof or analyzing the concentration distribution of elements in the layer (or in the film). Strictly speaking, the "interface" has the meaning of the boundary between the layers or between the films; however, here, the meaning is the vicinity of the boundary of the layers or films. In a case of observing the cross-section of the layer or film formed by a wet method, the interface is confirmed as a portion where the color is darker than the others or a portion where the color is lighter than the others in the vicinity of the boundary of the adjacent layer or film. In addition, in a case of analyzing the concentration distribution of the elements, the interface is confirmed as a portion where the concentration of the element is higher than in other portions or a portion where the concentration of the element is lower than in other portions in the vicinity of the boundary of the adjacent layer or film. Since the piezoelectric layer 70 is formed by repeating from the coating step up to the firing step a plurality of times (formed by a plurality of piezoelectric films), there are a plurality of interfaces corresponding to each of the piezoelectric films. That is, the piezoelectric layer 70 has an interface for each coating step and has a different interface for each firing step. However, in the interfaces formed for each coating step, the shape of and changes in the concentration distribution of the sodium or potassium are hardly influenced, and the concentration of each of the elements changes greatly for each firing step. That is, as described above, the sodium concentration in the first piezoelectric film 71 and the plurality of second piezoelectric films 72 is along a gradient in the film thickness direction (Z direction), being high on the first electrodes 60 side and low on the second electrode 80 side, and the concentration of the potassium is the reverse of that of the sodium.

The specific procedure in a case of forming the piezoelectric layer 70 with a solution method (wet method) is, for example, as follows. First, a precursor solution which includes a predetermined metal complex is adjusted. The precursor solution is a solution in which a metal complex which is able to form a composite oxide including K, Na, and Nb by firing is dissolved or dispersed in an organic solvent. At this time, metal complexes which include additives such as Mn may be further mixed therein.

Examples of metal complexes which include K include potassium 2-ethyl hexane acid, potassium acetate, and the like. Examples of metal complexes which include Na include sodium 2-ethyl hexane acid, sodium acetate, and the like. Examples of metal complexes which include Nb include niobium 2-ethyl hexane acid, pentaethoxyniobium, and the like. In a case of adding Mn as an additive, examples of metal complexes which include Mn include manganese 2-ethyl hexane acid, and the like. At this time, two or more metal complexes may be used in combination. For example, potassium 2-ethylhexyl hexane acid and potassium acetate may be used in combination as a metal complex which includes K. Examples of the solvent include 2-n-butoxyethanol, n-octane, mixed solvents thereof, or the like. The precursor solution may include an additive which stabilizes the dispersion of the metal complex including K, Na, and Nb. Examples of such additives include 2-ethylhexanoic acid.

Then, the precursor solution is coated on the wafer 110 formed of the vibrating plate 50 and the first electrodes 60 to form a precursor film (coating step). Next, the precursor film is heated to a predetermined temperature, for example, approximately 130° C. to 250° C. and dried for a set time (drying step). Next, the dried precursor film is degreased by being heated to a predetermined temperature, for example, approximately 300° C. to 450° C., and held at this temperature for a set time (degreasing step). Finally, when the KNN is crystallized by heating the degreased precursor film to a higher temperature, for example, 650° C. to 800° C. and holding the film at this temperature for a set time, the first piezoelectric film 71 is completed (firing step). In the same manner as the first piezoelectric film 71, by going through the series of steps from the coating step up to the firing step, the KNN is crystallized to form the second piezoelectric films 72, the second piezoelectric films 72 are formed thereon in sequence in the same manner, and a plurality of layers of the second piezoelectric films 72 are completed. Due to this, the piezoelectric layer 70 formed of the first piezoelectric film 71 and a plurality of layers of the second piezoelectric films 72 is formed.

Examples of the heating apparatus used in the drying step, the degreasing step, and the firing step include a Rapid Thermal Annealing (RTA) apparatus which heats by irradiation with an infrared lamp, a hot plate, or the like.

In addition, before and after forming the second electrode 80 on the piezoelectric layer 70, a reheating process (post-annealing) may be performed in a temperature range of approximately 600° C. to 800° C. according to necessity. In this manner, by performing the post-annealing, it is possible to form a favorable interface between the piezoelectric layer 70 and the first electrodes 60 or the second electrode 80, and it is possible to improve the crystallinity of the piezoelectric layer 70.

In the present embodiment, an alkali metal (K or Na) is included in the piezoelectric material. The alkali metal is easily diffused in the first electrodes 60 in the firing step described above. If the alkali metal reaches the wafer 110 by passing through the first electrodes 60, the alkali metal will react with the wafer 110. However, in the present embodiment, the insulating film 52 formed of the zirconium oxide described above functions as a stopper for K or Na. Accordingly, it is possible to suppress the alkali metal from reaching the wafer 110 which is a silicon substrate.

After that, the piezoelectric layer 70 formed of the first piezoelectric film 71 and the plurality of layers of the second piezoelectric films 72 are patterned and shaped as shown in FIG. 11. It is possible for the patterning to be performed by dry etching such as reactive ion etching or ion milling, or wet etching using an etchant. After that, the second electrode 80 is formed on the piezoelectric layer 70. It is possible to form the second electrode 80 using the same method as the first electrodes 60. Through the above steps, the piezoelectric element 300 provided with the first electrodes 60, the piezoelectric layer 70, and the second electrode 80 is completed. In other words, the portion where the first electrodes 60, the piezoelectric layer 70, and the second electrode 80 overlap forms the piezoelectric element 300.

Figure 12:
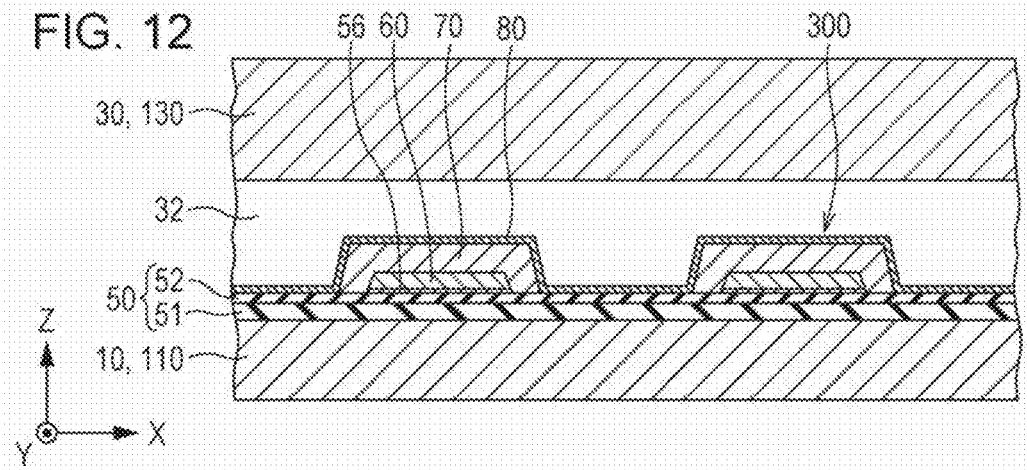
FIG. 12 is a cross-sectional view which shows a method of manufacturing the recording head.
Figure 13:
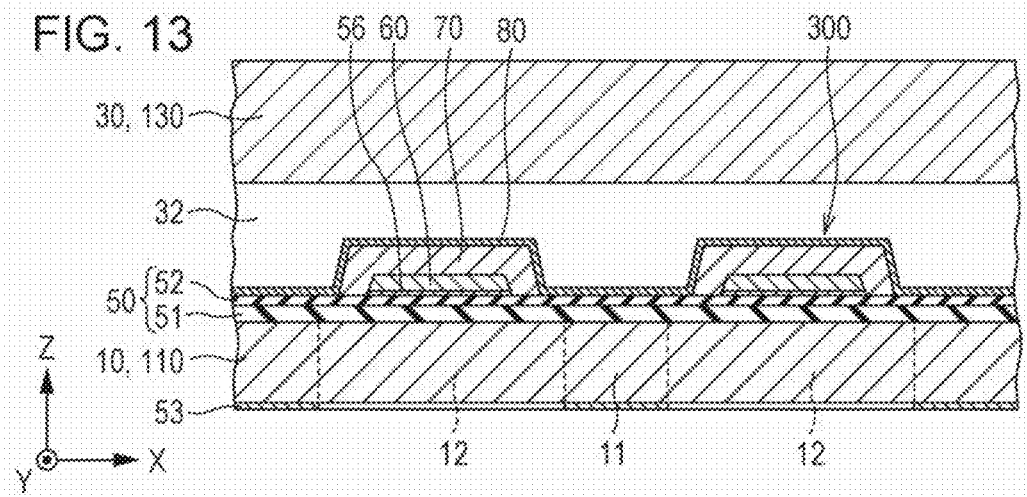
FIG. 13 is a cross-sectional view which shows a method of manufacturing the recording head.
Figure 14:
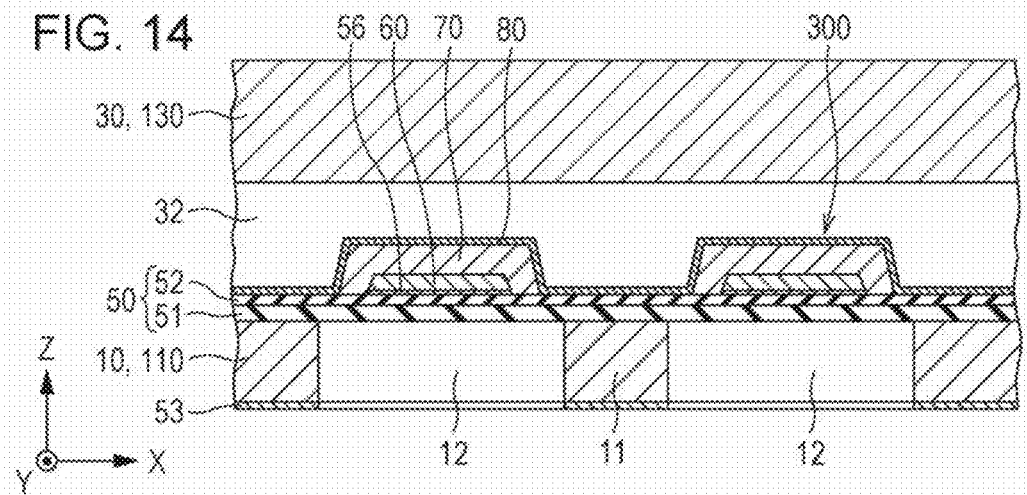
FIG. 14 is a cross-sectional view which shows a method of manufacturing the recording head.

Next, as shown in FIG. 12, the protective substrate wafer 130 is bonded with the surface of the wafer 110 on the piezoelectric element 300 side via an adhesive 35 (refer to FIG. 4). After that, the surface of the protective substrate wafer 130 is thinned by abrasion. In addition, the manifold portion 32 and the through hole 33 (refer to FIG. 4) are formed in the protective substrate wafer 130. Next, as shown in FIG. 13, a mask film 53 is formed on the surface of the wafer 110 on the opposite side to the piezoelectric element 300 and patterned into a predetermined shape. Then, as shown in FIG. 14, anisotropic etching (wet etching) using an alkali solution such as KOH is carried out on the wafer 110 via the mask film 53. Due to this, in addition to the pressure-generating chambers 12 corresponding to the individual piezoelectric elements 300, an ink supply path 13, the communication path 14, and the communication portion 15 (refer to FIG. 4) are formed.

Next, unnecessary portions of the outer peripheral edge of the wafer 110 and the protective substrate wafer 130 are cut and removed by dicing or the like. Furthermore, the nozzle plate 20 (refer to FIG. 4) is bonded with the surface of the wafer 110 on the opposite side to the piezoelectric element 300. In addition, the compliance substrate 40 (refer to FIG. 4) is bonded with the protective substrate wafer 130. Through the steps up to this point, the assembly of the chips of the recording head 1 is completed. The recording head 1 (refer to FIG. 2, and the like) is obtained by dividing the assembly into individual chips.

In the recording head 1 having the configuration as described above, after taking in ink from an external ink supply means (for example, the cartridges 2A and 2B in FIG. 1) and filling the inner portion from the manifold 100 up to the nozzle opening 21 with ink, by applying a voltage to each of the piezoelectric element 300 corresponding to pressure-generating chamber 12 in accordance with the recording signal from the driving IC (for example, driving circuit 120) and flexing and changing the shape of the piezoelectric element 300, the pressure in each of the pressure-generating chambers 12 is increased and ink droplets are ejected from the nozzle openings 21.

That is, the piezoelectric element 300 described above is a piezoelectric element 300 with a flexural vibration mode. When the piezoelectric element 300 with a flexural vibration mode is used, by the piezoelectric layer shrinking in an orthogonal direction (piezoelectric element holding portion 31 direction) to the application direction of the voltage along with the application of the voltage, the piezoelectric element 300 and the vibrating plate 50 flex to the pressure-generating chamber 12 side, due to which the pressure-generating chamber 12 is contracted. On the other hand, due to the piezoelectric layer 70 extending in the piezoelectric element holding portion 31 direction by reducing the application voltage, the piezoelectric element 300 and the vibrating plate 50 flex to the opposite side of the pressure-generating chambers 12, due to which the pressure-generating chamber 12 is expanded. In the recording head 1, since the volume of the pressure-generating chambers 12 changes in correspondence with the charging and discharging of the piezoelectric element 300, it is possible to eject liquid droplets from the nozzle openings 21 by using the pressure changes in the pressure-generating chambers 12.

EXAMPLES

A description will be given below of Examples of the present invention. Here, the present invention is not limited to the following Examples.

Example 1

By thermal oxidation of the surface of the silicon substrate which is the substrate 10, the elastic film 51 formed of silicon dioxide was formed on the silicon substrate. Next, by forming a zirconium film by a sputtering method on the elastic film 51 and carrying out thermal oxidation on the zirconium film, the insulating film 52 formed of zirconium oxide was formed. Next, by forming a titanium film by a sputtering method on the insulating film 52 and carrying out thermal oxidation on the titanium film, an adhesive layer 56 formed of titanium oxide was formed. Then, after forming a platinum film by a sputtering method on the adhesive layer 56, by patterning into a predetermined shape, the first electrodes 60 with a thickness of 50 nm were formed.

Next, the piezoelectric layer 70 was formed by the following procedure. First, a 2-n-butoxyethanol solution of potassium acetate, an n-octane solution of sodium acetate, and a 2-n-ethylhexanoic acid solution of pentaethoxyniobium were mixed and precursor solution (K/Na=1/1) with a sol concentration (metal element concentration) of 0.6 M/L was prepared.

Next, the prepared precursor solution was coated on the silicon substrate described above where the first electrodes 60 were formed, by a spin coating method at 1500 rpm to 3000 rpm (coating step). Next, the silicon substrate was placed on a hot plate and dried for five minutes at 180° C. (drying step). Next, degreasing was performed for 10 minutes at 350° C. with respect to the silicon substrate on the hot plate (degreasing step). Next, firing was performed for five minutes at 750° C. using an RTA apparatus (firing step). Then, the first piezoelectric film 71 (KNN film) with a thickness of 70 nm was formed.

Next, by repeating from the coating step to the firing step a further six times, the second piezoelectric films 72 of the second to seventh layers with a thickness of 80 nm were each formed, and the piezoelectric layer 70 (KNN layer) with a thickness of 550 nm formed of seven layers of piezoelectric films was formed.

Example 2

The piezoelectric layer 70 of Example 2 was formed in the same manner as Example 1 except that the first piezoelectric film 71 with a thickness of 35 nm was formed, and the piezoelectric layer 70 with a thickness of 515 nm formed of seven layers of piezoelectric films was formed.

Comparative Example 1

The piezoelectric layer 70 of Comparative Example 1 was formed in the same manner as Example 1 except that the first piezoelectric film 71 with a thickness of 80 nm was formed, and the piezoelectric layer 70 with a thickness of 560 nm formed of seven layers of piezoelectric films was formed.

Comparative Example 2

The piezoelectric layer 70 of Comparative Example 2 was formed in the same manner as Example 1 except that the first piezoelectric film 71 with a thickness of 112 nm was formed, and the piezoelectric layer 70 with a thickness of 592 nm formed of seven layers of piezoelectric films was formed.

Comparative Example 3

The piezoelectric layer 70 of Comparative Example 3 was formed in the same manner as Example 1 except that the first piezoelectric film 71 with a thickness of 27 nm was formed, and the piezoelectric layer 70 with a thickness of 507 nm formed of seven layers of piezoelectric films was formed.

SIMS Analysis

Figure 15:
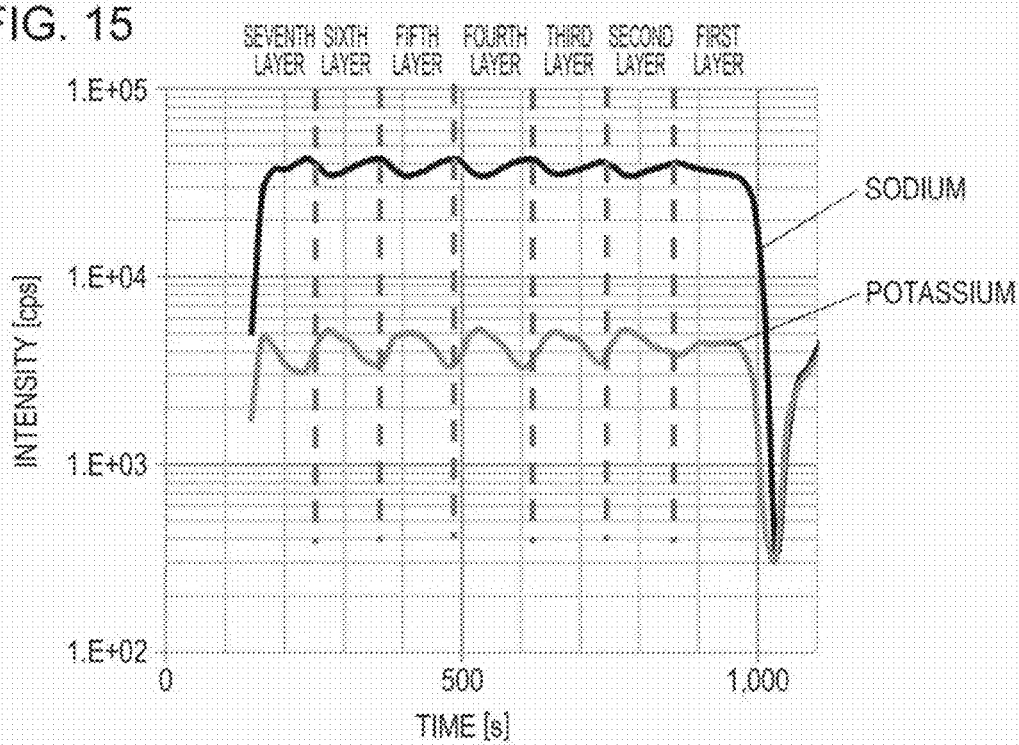
FIG. 15 is a diagram which shows a SIMS analysis profile of Example 1.

For Example 1 and Comparative Example 1, the depth direction concentration profiles of each of sodium (Na) and potassium (K) from the surface side of each piezoelectric layer 70 to the first electrodes 60 were measured using secondary ion mass spectrometry (SIMS). FIG. 15 shows the SIMS analysis profile of the piezoelectric layer 70 of Example 1 and FIG. 16 shows the SIMS analysis profile of the piezoelectric layer 70 of Comparative Example 1.

As shown in FIG. 15, the Na concentration was increased on the first piezoelectric film 71 side (substrate side) of the lower layer in the piezoelectric layer 70 of Example 1. On the other hand, the K concentration was lowered at the first piezoelectric film 71 side of the lower layer and increased at the surface side of the piezoelectric films of each layer in the piezoelectric layer 70. Here, in FIG. 15, the left side (side of the x axis where the etching time is 0) of the diagram is the surface of the piezoelectric layer 70 and the interior of the piezoelectric layer 70 is illustrated toward the right side (side of the x axis where the etching time is 1000) of the diagram. In addition, the gradient degree of the Na concentration and the gradient degree of the K concentration in each of the layers of the piezoelectric films were homogeneous without difference between each of the layers of the piezoelectric films.

Figure 16:
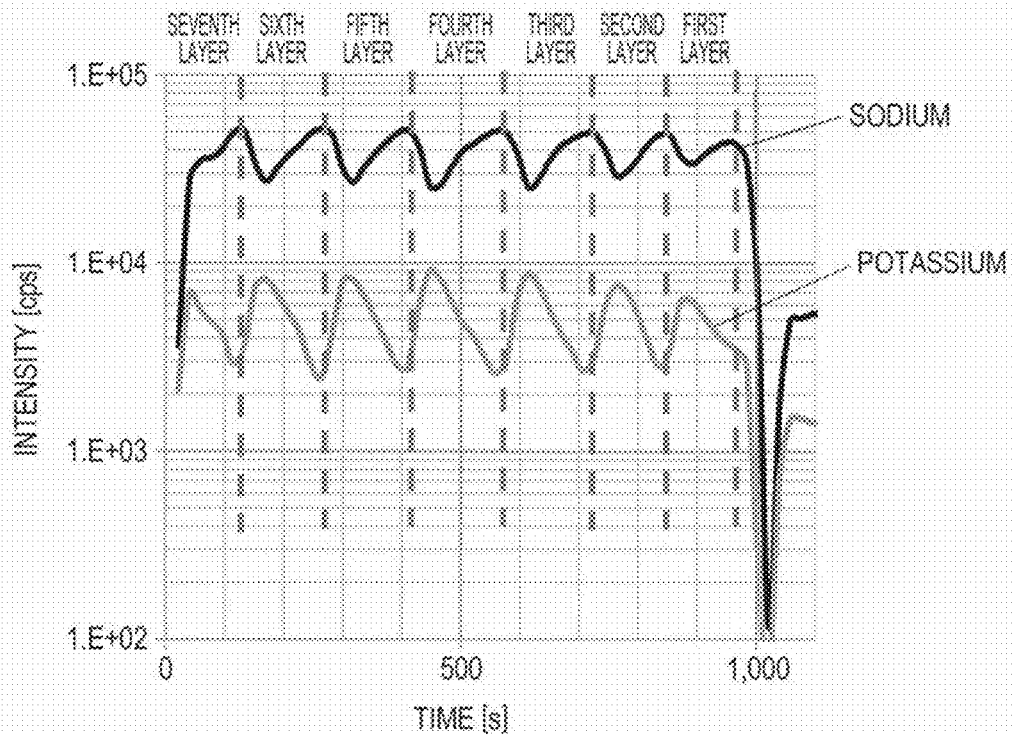
FIG. 16 is a diagram which shows a SIMS analysis profile of Comparative Example 1.

As shown in FIG. 16, in the piezoelectric layer 70 of Comparative Example 1, the Na concentration was low on the first piezoelectric film 71 side (substrate side) of the lower layer and the K concentration was high on the first piezoelectric film 71 side of the lower layer and the concentrations of Na and K had the opposite results to the profile of Example 1. The piezoelectric layer 70 of Comparative Example 1 had lower adhesion between the first piezoelectric film 71 and the first electrodes 60. In addition, as shown in FIG. 16, the gradient of the K concentration was not homogeneous and the piezoelectric and dielectric characteristics depending on the composition (K:Na ratio) were not stable. Furthermore, the columnar shape of the crystal grains was lost and the toughness (mechanical characteristic) with respect to external stresses was decreased.

XRD Measurement

Figure 17:
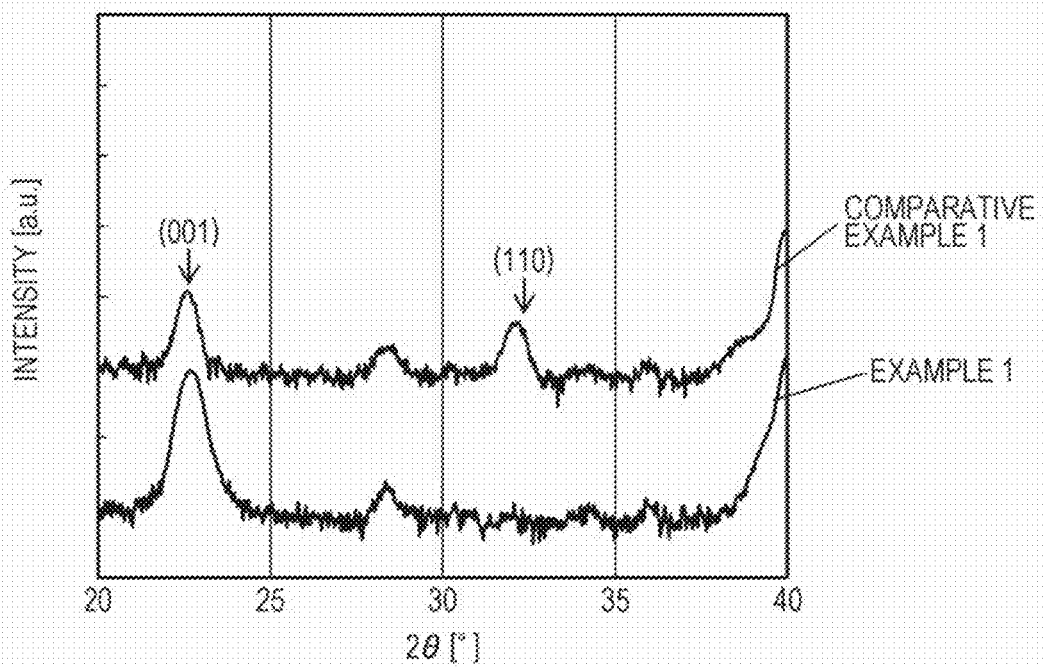
FIG. 17 is a diagram which shows each X-ray diffraction pattern of Example 1 and Comparative Example 1.

For each of Example 1, Example 2, and Comparative Examples 1 to 3, measurement of the X-ray diffraction pattern was performed using an X-ray diffraction (XRD) method. FIG. 17 shows the X-ray diffraction patterns of Example 1 and Comparative Example 1 and FIG. 18 shows the X-ray diffraction patterns of Examples 1 and 2 and Comparative Examples 2 and 3.

In general, in the X-ray diffraction pattern of the KNN layer, a peak where 2θ is derived in the (001) plane in the vicinity of 22.5° and a peak where 2θ is derived in the (110) plane in the vicinity of 32.0° are observed. As shown in FIGS. 17 and 18, in the piezoelectric layer 70 (KNN layer) of Examples 1 and 2, since a large peak where 2θ is in the vicinity of 22.5° is observed and a peak where 2θ is in the vicinity of 32.0° is not observed, the piezoelectric layers 70 were clearly oriented with the (001) plane.

Figure 18:
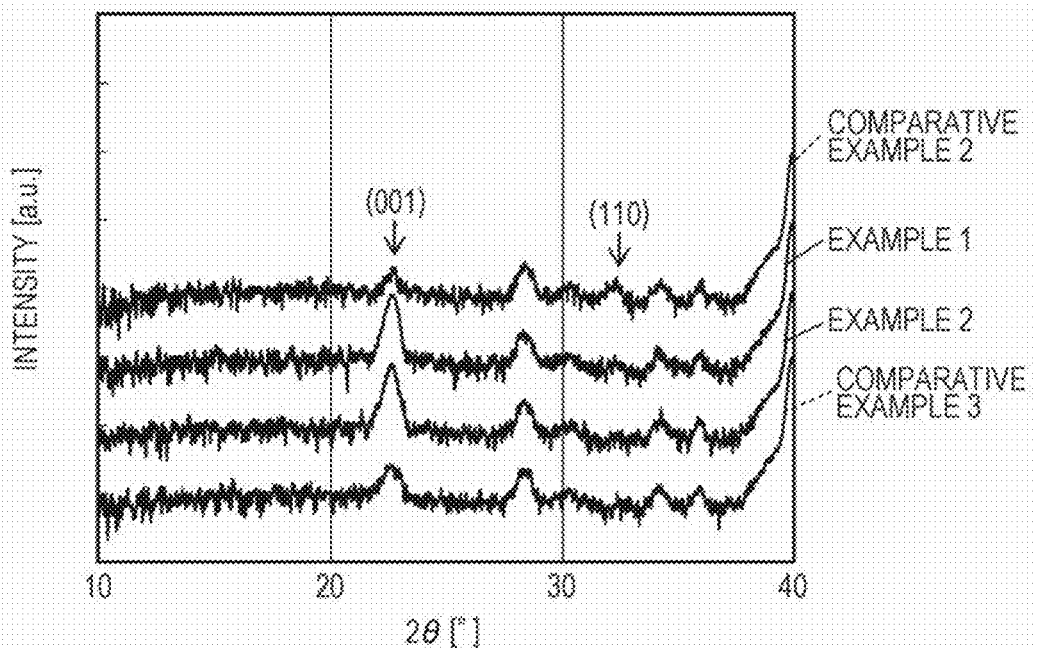
FIG. 18 is a diagram which shows each X-ray diffraction pattern of Examples 1 and 2 and Comparative Examples 2 and 3.

On the other hand, as shown in FIG. 17 and FIG. 18, in the piezoelectric layers 70 of Comparative Examples 1 and 2, peaks where 2θ is in the vicinity of 22.5° and in the vicinity of 32.0° are observed; however, since the peak where 2θ is in the vicinity of 22.5° is smaller than the peaks of Examples 1 and 2, although oriented with the (001) plane, it was clear that the orientation was less than that of Examples 1 and 2. In addition, in the piezoelectric layer 70 of Comparative Example 3, a large peak where 2θ is in the vicinity of 22.5° is observed and a peak where 2θ is in the vicinity of 32.0° is hardly observed; however, since the peak where 2θ is in the vicinity of 22.5° is smaller than the peaks of Examples 1 and 2, although oriented with the (001) plane, it was clear that the orientation was less than that of Examples 1 and 2.

Here, in FIGS. 17 and 18, the peak where 2θ is observed in the vicinity of 40° is a peak derived from the platinum forming the first electrodes 60.

In Example 1, according to the SIMS analysis, it is clear that a large amount of Na was present on the first electrodes 60 side of the piezoelectric layer 70. In other words, as will be described in detail below, in consideration of $NaNbO_3$ being more easily crystallized than $KNbO_3$, it is considered that, since the KNN crystallizes from the first electrodes 60 side, the crystal state of the KNN crystal on the first electrodes 60 side is easily continued, and the KNN is crystallized by continuing with the information of the orientation from the first electrodes 60. As a result, since the KNN is continuously oriented with the (001) plane from the first electrodes 60, it is considered to show a strong orientation with the (001) plane in the XRD measurement results.

On the other hand, in Comparative Example 1, according to the SIMS analysis, it is clear that a large amount of Na is not present on the first electrodes 60 side in the first piezoelectric film 71 on the first electrodes 60. That is, since the KNN is not crystallized from the first electrodes 60 side and the orientation of the KNN crystal on the first electrodes 60 side is not easily continued, it is considered that the orientation with the (001) plane in the KNN is weak in the first piezoelectric film 71 on the first electrodes 60. Then, in the second piezoelectric film 72 of the second layer formed on the first piezoelectric film 71 in this manner, since the orientation with the (001) plane is already weak even when the amount of Na on the first electrodes 60 side is great, it is considered that the piezoelectric film 74 is subsequently stacked as it is with the weak orientation with the (001) plane. That is, when the first piezoelectric film of KNN is not oriented with the (001) plane, it is inferred that the piezoelectric film of the layer thereon is also not oriented with the (001) plane.

Factor Determining Na Concentration Gradient and K Concentration Gradient

Figure 20:
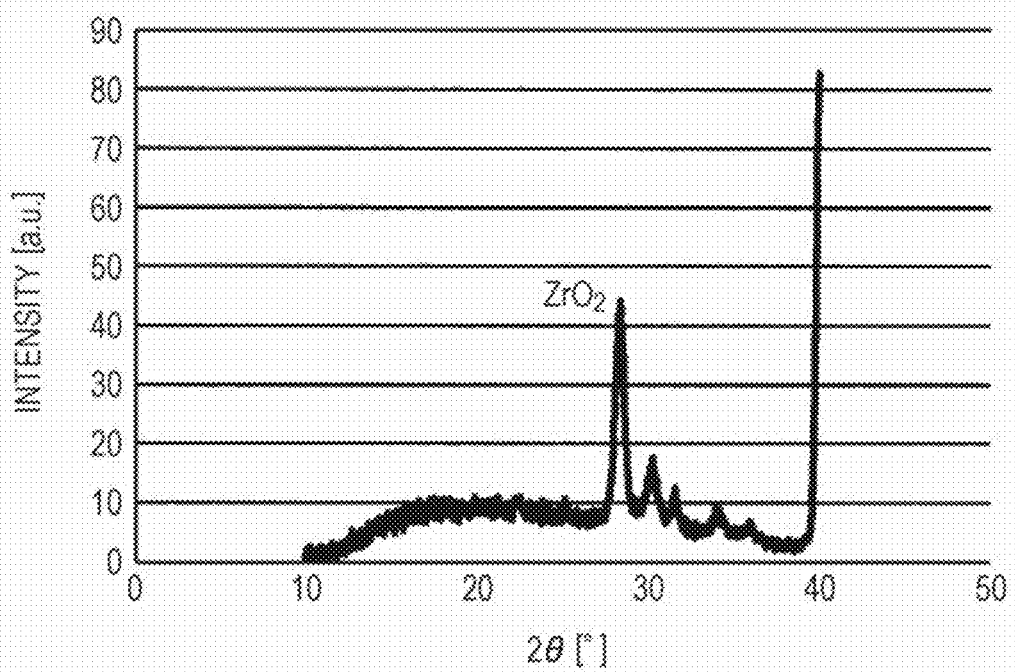
FIG. 20 is a diagram which shows an X-ray diffraction pattern of a sample b.
Figure 21:
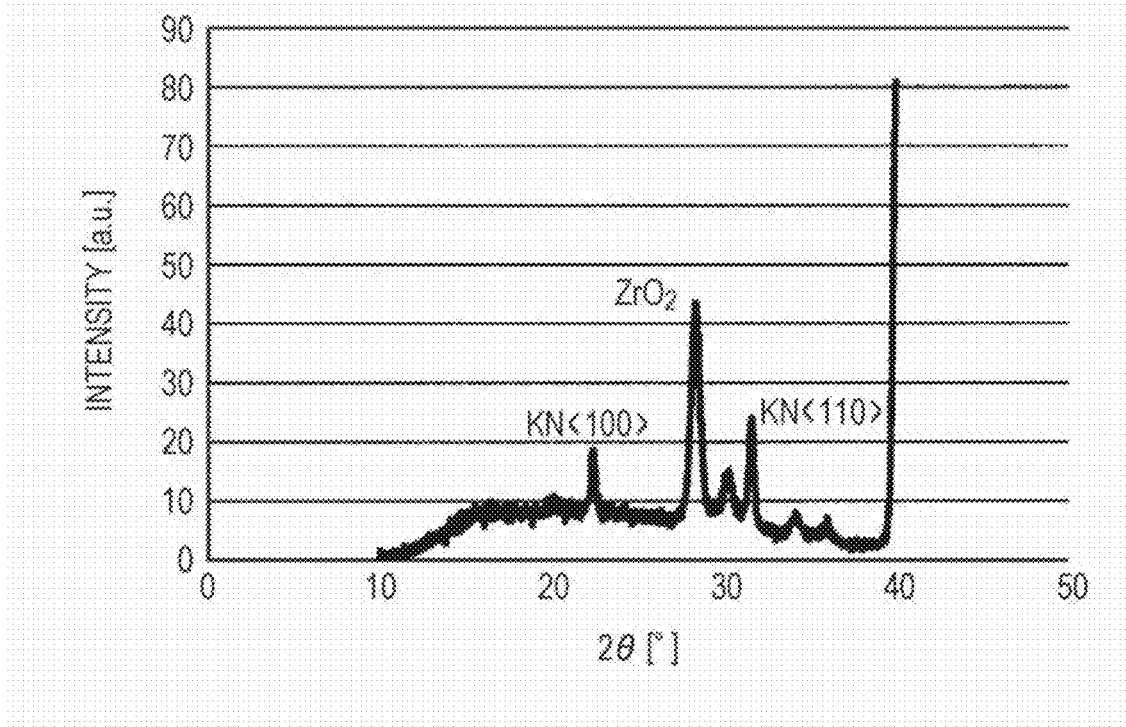
FIG. 21 is a diagram which shows an X-ray diffraction pattern of a sample c.

The measurement of the X-ray diffraction patterns was performed for each of a sample a where a film formed of a single composition of $NaNbO_3$ was formed by firing at 550° C., a sample b where a film formed of a single composition of $KNbO_3$ was formed by firing at 550° C., and a sample c where a film formed of a single composition of $KNbO_3$ was formed by firing at 650° C. The X-ray diffraction pattern of sample a is shown in FIG. 19, the X-ray diffraction pattern of sample b is shown in FIG. 20, and the X-ray diffraction pattern of sample c is shown in FIG. 21.

Figure 19:
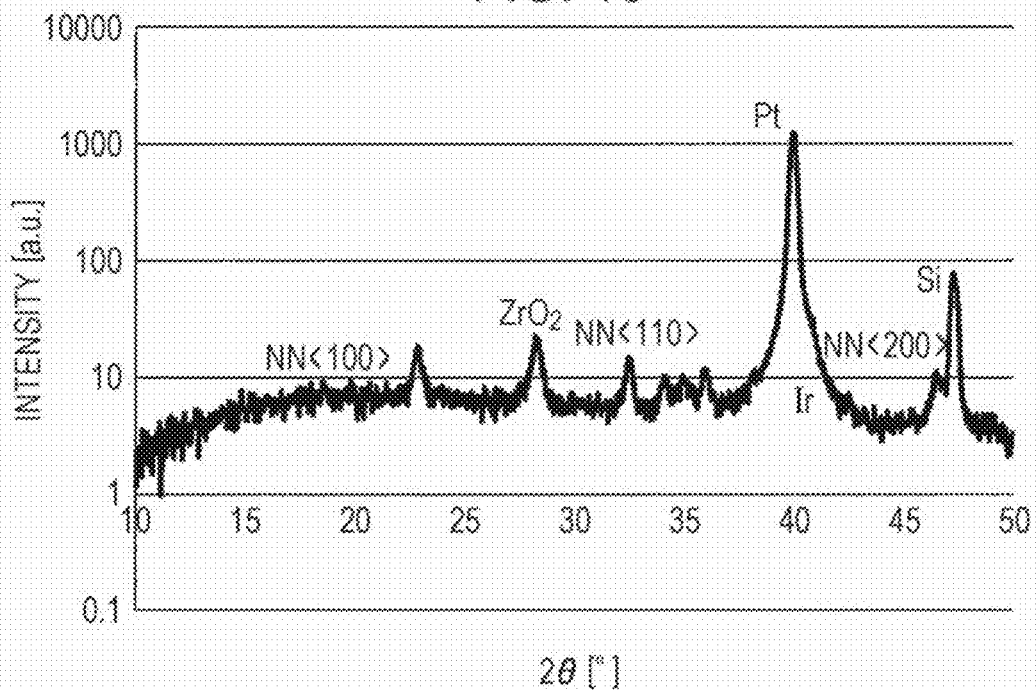

As shown in FIG. 19, since the peak derived from <100> of $NaNbO_3$ where 2θ is in the vicinity of 22° was observed, it is understood that $NaNbO_3$ crystallizes when fired at 550° C. On the other hand, as shown in FIG. 20, for $KNbO_3$, a peak derived from $ZrO_2$ where 2θ is in the vicinity of 28° is observed at a firing temperature of 550° C., and, as shown in FIG. 21, since the peak derived from <100> of $KaNbO_3$ is not observed when the firing temperature does not reach 650° C., it is understood that $KNbO_3$ crystallizes easily at 650° C. without crystallizing when the firing temperature is 550° C. From this result, in a case of firing and producing the KNN, it is understood that the Na concentration is high and the K concentration is low in the place which is the starting point where the crystallization starts.

That is, in Example 1, that the gradient of the Na concentration of the first piezoelectric film 71 is low at the layer surface side and high at the first electrodes 60 interface side has the meaning that the crystallization starting point is not at the thin film surface side, but at the first electrodes 60 interface side when the KNN of the first piezoelectric film 71 is crystallized. On the other hand, in Comparative Example 1, that the gradient of the Na concentration of the first piezoelectric film 71 is the opposite of Example 1 has the meaning that the crystallization starting point is not on the first electrodes 60 interface side, but on the thin film surface side when crystallizing the KNN of the first piezoelectric film 71.

That is, the factor determining the Na concentration gradient and the K concentration gradient is not the firing temperature, but the thickness of the first piezoelectric film 71. By setting the thickness of the first piezoelectric film 71 to 30 nm to 70 nm, the gradient of the Na concentration of the first piezoelectric film 71 is low at the layer surface side and high at the first electrodes 60 interface side and naturally, the gradient of the K concentration is the reverse of the gradient of the Na concentration. Due to this, it is inferred that it is possible to obtain the piezoelectric layer 70 where the composition distribution is homogeneous in the in-plane direction and the film thickness direction.

Other Embodiments

Description was given above of embodiments of a piezoelectric material, a piezoelectric element, a liquid ejecting head, and a liquid ejecting apparatus on which the piezoelectric element is mounted of the present invention; however, the basic configuration of the present invention is not limited to the above description.

In the first embodiment described above, description was given of an ink jet recording head as a liquid ejecting head; however, the present invention is broadly applicable to liquid ejecting heads in general and application is naturally possible to a liquid ejecting head which ejects a liquid other than ink. Examples of other liquid ejecting heads include various recording heads used in image recording apparatuses such as printers, color material ejecting heads used in the manufacturing of color filters such as liquid crystal displays, organic EL displays, electrode material ejecting heads used when forming electrodes such as field emission displays (FED), bio material ejecting heads used in biochip manufacturing, and the like.

In addition, the present invention is not limited to a piezoelectric element mounted on a liquid ejecting head, and application is also possible to a piezoelectric element mounted on another piezoelectric element application device. Examples of piezoelectric element application devices include ultrasonic devices, motors, pressure sensors, pyroelectric element, ferroelectric elements, and the like. In addition, a complete body utilizing these piezoelectric element application devices, for example, an apparatus ejecting liquid or the like using the head ejecting liquid or the like described above, an ultrasound sensor using the ultrasonic device described above, a robot where the motor described above is used as the driving source, an IR sensor using the pyroelectric element described above, a ferroelectric memory using a ferroelectric element, and the like are also included in the piezoelectric element application devices.

The constituent elements shown in the drawings, that is, the thicknesses, widths, relative positional relationships and the like of the layers or the like may be enlarged in order to illustrate the present invention. In addition, the term "on" in the present specification is not limited to meaning that the positional relationship of the constituent elements is "directly on". For example, the expressions "first electrode on the substrate" or "piezoelectric layer on the first electrode" does not exclude including other constituent elements between the substrate and the first electrode or between the first electrode and the piezoelectric layer.

The entire disclosure of Japanese Patent Application No. 2016-024082, filed Feb. 10, 2016 is expressly incorporated by reference herein.

What is claimed is:

1. A piezoelectric element comprising:
a first electrode;
a piezoelectric layer formed of a first piezoelectric film formed on the first electrode, a second piezoelectric film formed on the first piezoelectric film, and a third piezoelectric film formed on the second piezoelectric film, each of the first, second, and third piezoelectric films including potassium, sodium, and niobium; and
a second electrode formed on the piezoelectric layer,
wherein the piezoelectric layer is a stacked structure of the first, second, and third piezoelectric films,
the first piezoelectric film has a thickness of 30 nm to 70 nm, and
a concentration of sodium in the first piezoelectric film is greater than a concentration of sodium in the second piezoelectric film, and the concentration of sodium in the second piezoelectric film is greater than a concentration of sodium in the third piezoelectric film.

2. The piezoelectric element according to claim 1,
wherein the first piezoelectric film formed on the first electrode is provided without a titanium film being interposed therebetween.

3. A piezoelectric element application device comprising: the piezoelectric element according to claim 1.

4. A piezoelectric element application device comprising: the piezoelectric element according to claim 2.

* * * * *